United States Patent
Goldberg et al.

(10) Patent No.: US 7,600,211 B1
(45) Date of Patent: Oct. 6, 2009

(54) TOGGLE EQUIVALENCE PRESERVING LOGIC SYNTHESIS

(75) Inventors: Evgueni Goldberg, Berkeley, CA (US); Kanupriya Gulati, College Station, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 200 days.

(21) Appl. No.: 11/527,198

(22) Filed: Sep. 25, 2006

(51) Int. Cl.
*G06F 17/50* (2006.01)

(52) U.S. Cl. .................. 716/18; 716/1; 716/3; 716/4; 716/5; 716/7

(58) Field of Classification Search .................. 716/1–5, 716/7; 703/14
See application file for complete search history.

(56) References Cited

U.S. PATENT DOCUMENTS

| | | | |
|---|---|---|---|
| 5,991,524 A * | 11/1999 | Belkhale et al. | 716/18 |
| 6,397,170 B1 * | 5/2002 | Dean et al. | 703/14 |
| 6,983,435 B2 * | 1/2006 | Baumgartner et al. | 716/5 |
| 7,100,143 B2 * | 8/2006 | Teig et al. | 716/18 |
| 7,137,084 B1 * | 11/2006 | Chen et al. | 716/4 |
| 7,215,142 B1 * | 5/2007 | Fairbanks | 326/55 |
| 7,240,311 B2 * | 7/2007 | Lai et al. | 716/5 |
| 7,360,185 B2 * | 4/2008 | Baumgarter et al. | 716/5 |
| 7,373,618 B1 * | 5/2008 | Khoo et al. | 716/3 |
| 7,380,226 B1 * | 5/2008 | Goldberg | 716/5 |

OTHER PUBLICATIONS

Goldberg et al.; "Toggle Equivalence Preserving (TEP) Logic Optimization"; Aug. 29-31, 2007; Digital System Design Architectures, Methods and Tools, 2007. DSD 2007. 10th Euromicro Conference on; pp. 271-279.*

Goldberg et al.; "Using SAT for combinational equivalence checking"; Mar. 13-16, 2001; Design, Automation and Test in Europe, 2001. Conference and Exhibition 2001. Proceedings; pp. 114-121.*

Mishchenko et al.; "Improvements to Combination Equivalence Checking"; Nov. 2006; Computer-Aided Design, 2006. ICCAD '06. IEEE/ACM International Conference on; pp. 836-843.*

Eugene Goldberg, "On Equivalence Checking and Logic Synthesis of Circuits with a Common Specification," GLSVLSI'05, Apr. 17-19, 2005, Chicago, IL, pp. 102-107.

E. M. Sentovich, K. J. Singh, L. Lavagno, C. Moon, R. Murgai, A. Saldanha, H. Savoj, P. R. Stephan, R. K. Brayton and A. L. Sangiovanni-Vincentelli, "SIS: A System for Sequential Circuit Synthesis," Tech. Rep. UCB/ERL M92/41, Electronics Research Lab, Univ. of California, Berkeley, CA, May 4, 1992.

(Continued)

*Primary Examiner*—Helen Rossoshek
(74) *Attorney, Agent, or Firm*—Duane Morris LLP; Stephen C. Durant

(57) ABSTRACT

A method of synthesis of a second circuit ($N_2$) that is toggle equivalent to a first circuit ($N_1$), comprising building up $N_2$ in topological order, starting from the input side of $N_2$, by producing a sequence of subcircuit designs $N_{2(1)}$ through $N_{2(k)}$, such that output toggling of circuit $N_1$ implies output toggling of subcircuit $N_{2(i)}$ for every i=1, . . . , k; and output toggling of $N_{2(j)}$ strictly implies output toggling of $N_{2(i)}$ if i<j.

31 Claims, 23 Drawing Sheets

OTHER PUBLICATIONS

S. Yamashita, H. Sawada and A. Nagoya, "A New Method to Express Functional Permissibilities for LUT Based FPGAs and Its Applications," in Proc. of IEEE International Conference on Computer-Aided Design, pp. 254-261, Nov. 1996.

U.S. Appl. No. 11/027,085, entitled, "Method and Apparatus to Perform Logic Synthesis Preserving High-Level Specification", filed Dec. 29, 2004, invented by E. Goldberg.

S. Sinha and R. K. Brayton, "Implementation and Use of SPFDs in Optimizing Boolean Networks," in Proc. of IEEE International Conference an Computer-Aided Design, pp. 103-110, Nov. 1998.

R. K. Brayton and C. McMullen, "The Decomposition and Factorization of Boolean Expressions," in Proc. of IEEE International Symposium on Circuits and Systems, pp. 49-54, May 1982.

J. Vasudevamurthy and J. Rajski, "A Method for Concurrent Decomposition and Factorization of Boolean Expressions," in Proc. of IEEE International Conference on Computer-Aided Design, pp. 510-513, Nov. 1990.

H. Savoj and R. K. Brayton, "The Use of Observability and External Don't Cares for the Simplification of Multi-Level Networks," in Proc. of ACM/IEEE Design Automation Conference, pp. 297-301, Jun. 1990.

H. Savoj, R. K. Brayton and H. J. Touati, "Extracting Local Don't Cares for Network Optimization," in Proc. of IEEE International Conference on Computer-Aided Design, pp. 514-517, Nov. 1991.

H. Savoj, "Don't Cares in Multi-Level Network Optimization," PhD thesis, University of California Berkeley, Electronics Research Laboratory, College of Engineering, University of California, Berkeley, CA, May 1992.

S. P. Khatri, S. Sinha, R. K. Brayton and A. L. Sangiovanni-Vincentelli, "SPFD-Based Wire Removal in Standard-Cell and Network-of-PLA Circuits," IEEE Trans. on Computer-Aided Design of Integrated Circuits and Systems, vol. 23, No. 7, pp. 1020-1030, Jul. 2004.

S. Sinha, A. Kuehlmann and R. K. Brayton, "Sequential SPFDs," in Proc. of IEEE International Conference on Computer-Aided Design, pp. 84-90, Nov. 2001.

S. Sinha, A. Mishchenko and R. K. Brayton, "Topologically Constrained Logic Synthesis," in Proc. of IEEE International Conference on Computer-Aided Design, pp. 679-686, Nov. 2002.

R. E. Bryant, "Graph-Based Algorithms for Boolean Function Manipulation," IEEE Trans. on Computers, vol. C-35, No. 8, pp. 677-691, Aug. 1986.

F. Somenzi, "Cudd: Cu Decision Diagram Package Release 2.4.1," Dept. of Electrical and Computer Engineering, Univ. of Colorado at Boulder, downloaded Apr. 27, 2006. Available online at http://vlsi.colorado.edu/~fabio/CUDD/.

\* cited by examiner

| Number | X | Y | X' | Y' |
|--------|---|---|----|----|
| 1 | 1 | 0 | 0 | 1 |
| 2 | 1 | 1 | 0 | 0 |

Figure 7a

| Number | X | Y | X' | Y' |
|--------|---|---|----|----|
| 1 | 0 | 1 | 0 | 0 |
| 2 | 1 | 0 | 0 | 0 |

Figure 7b

| P | Q | P' | Q' |
|---|---|----|----|
| 1 | 0 | 0  | 1  |

Figure 7c

| Number | $X$ | $Y$ | $Z$ | $X'$ | $Y'$ | $Z'$ |
|---|---|---|---|---|---|---|
| 1 | 0 | 0 | 1 | 0 | 0 | 0 |
| 2 | 0 | 1 | 0 | 0 | 0 | 1 |
| 3 | 1 | 0 | 0 | 0 | 0 | 1 |
| 4 | 1 | 1 | 0 | 0 | 0 | 1 |
| 5 | 0 | 1 | 0 | 0 | 0 | 0 |
| 6 | 1 | 0 | 0 | 0 | 0 | 0 |
| 7 | 1 | 1 | 0 | 1 | 0 | 0 |
| 8 | 1 | 1 | 0 | 0 | 0 | 0 |
| 9 | 1 | 1 | 0 | 0 | 1 | 0 |
| 10 | 1 | 0 | 0 | 0 | 1 | 0 |
| 11 | 1 | 0 | 1 | 0 | 1 | 1 |
| 12 | 1 | 1 | 1 | 0 | 1 | 1 |
| 13 | 1 | 1 | 1 | 1 | 0 | 1 |

Figure 9a

| Number | X | Y | Z | X | Y | Z |
|---|---|---|---|---|---|---|
| 1 | 0 | 0 | 1 | 0 | 0 | 0 |
| 2 | 0 | 1 | 0 | 0 | 0 | 0 |
| 3 | 1 | 0 | 0 | 0 | 0 | 0 |
| 4 | 1 | 1 | 0 | 1 | 0 | 0 |
| 5 | 1 | 1 | 0 | 0 | 1 | 0 |
| 6 | 1 | 1 | 1 | 0 | 1 | 1 |
| 7 | 1 | 1 | 1 | 1 | 0 | 1 |

Figure 9b

| Number | T | Z | T' | Z' |
|--------|---|---|----|----|
| 1 | 1 | 0 | 0 | 0 |
| 2 | 1 | 1 | 1 | 0 |

Figure 9c

TOGGLE EQUIVALENCE PRESERVING LOGIC SYNTHESIS

BACKGROUND OF THE INVENTION

1. Field of the Invention

The invention relates in general to the design of electronic circuits and more particularly to logic synthesis.

2. Description of the Related Art

In general, logic synthesis involves conversion of a more abstract higher level description of intended behavior of a circuit design to a less abstract more specific lower level description of circuit elements and their interconnection that can implement the intended behavior. For example, a synthesis process may convert a register transfer level (RTL) description of desired circuit behavior to a gate level description of a circuit that implements that behavior. Logic synthesis processes often employ optimization techniques. For example, optimization criteria, such as minimizing gate count or minimizing the number of levels in a combinational logic circuit, may guide the development of a circuit implementation that exhibits desired behavior. More particularly, a synthesis process may employ a cost function in accordance with an optimization technique to determine what combination of logic gates and their interconnection to employ in a circuit implementation. A synthesis process typically produces a circuit implementation that includes combinational logic elements.

Often, one goal of a logic synthesis process is to implement intended behavior specified as a Boolean function f as a combinational circuit, which is optimized with respect to some cost function. An optimization algorithm (or process) may be used to achieve optimization relative to a cost function. Certain optimization algorithms may be tuned to direct a synthesis process according to one or more criteria specified through a cost function. Scalable logic optimization algorithms are desirable since the number circuit elements in combinational logic blocks (i.e. blocks of combinational circuit elements) may be large in modem integrated circuits (ICs). Preferably, a scalable algorithm for an optimization problem exhibits polynomial (in practice, close to linear) complexity, and operates to select an optimal solution from a "large" portion of the search space.

Multi-level logic synthesis can be performed using algebraic means such as factorization as described in R. Brayton and C. McMullen, "The Decomposition and Factorization of Boolean Expressions," in *Proc. IEEE International Symposium on Circuits and Systems*, pp. 49-54, May 1982, or using kerneling as described by R. Brayton and C. McMullen. and as described in J. Vasudevamurthy and J. Rajski, "A Method for Concurrent Decomposition and Factorization of Boolean Expressions," in *Proc. of IEEE International Conference on Computer-Aided Design*, pp. 510-513, November 1990. Although these techniques are fast, being algebraic, they explore only a limited portion of the optimization space. Other ODC techniques described in H. Savcj and R. Brayton, "The Use of Observability and External Don't Cares for the Simplification of Multi-Level Networks," in *Proc. of ACM/IEEE Design Automation Conference*, pp. 297-301, June 1990 and in H. Savoj, R. Brayton, and H. Touati, "Extracting Local Don't Cares for Network Optimization," in *Proc. of IEEE International Conference on Computer-Aided Design*, pp. 514-517, November 1991 and other CODC techniques described in H. Savoj, *Don't Cares in Multi-Level Network Optimization*. PhD thesis, University of California Berkeley, Electronics Research Laboratory, College of Engineering, University of California, Berkeley, Calif. 94720, May 1992, perform "don't care" based optimization, but they do not modify the structure of the circuit. Although occasionally a node gets removed as a result of "don't care" based optimization, such an occurrence is rare. Toggle equivalence is different from the algebraic techniques, since it explores the "Boolean" options in the search space, while it differs from multi-level "don't care" based techniques since it does not restrict itself to the original network topology.

In E. Goldberg, On Equivalence Checking and Logic Synthesis of Circuits with a Common Specification, GLSVLSI, Chicago, Apr. 17-19, 2005, pp. 102-107 and commonly assigned U.S. Pat. No. 7,380,226, entitled, Method and Apparatus to Perform Logic Synthesis Preserving High-Level Specification, issued May 27, 2008, invented by E. Goldberg, (the "TEQLS references") a new method of logic synthesis was introduced. This method is referred to as TEQLS (pronounced "tickles"), which stands for Toggle Equivalence-preserving Logic Synthesis. Each of the TEQLS references is expressly incorporated herein by this reference as if expressly set forth herein in its entirety.

As shown in FIG. 1, assume that a partitioning of N into subcircuits $N^i$, i=1, 2, ..., k is specified. A goal of the TEQLS method is to optimize N by replacing each subcircuit $N^i$ with a toggle equivalent counterpart $N^{i*}$, i=1, 2, ..., k. Subcircuits $N^{i*}$ are connected exactly as $N^i$, forming a circuit N* whose outputs are functionally equivalent (modulo negation) to corresponding outputs of N.

The TEQLS procedure is linear in the number of subcircuits $N^i$ and exponential in the sizes of $N^i$ and $N^{i*}$. Hence, TEQLS has linear complexity if the size of subcircuits $N^i$ and $N^{i*}$ is bounded (which in practice, still leaves a huge number of candidate circuits). This efficiency stems from the fact that when replacing a subcircuit $N^i$ with a subcircuit $N^{i*}$, their toggle equivalence is maintained only locally in terms of input variables of $N^i$ and $N^{i*}$, related by so-called correlation functions, which are described in the TEQLS references and which can be efficiently computed.

Recently, Sets of Pairs of Functions to be Distinguished (SPFDs) were introduced as a new way to do logic optimization. Although SPFDs were introduced in the context of FPGA synthesis, S. Yamashita, H. Sawada, and A. Nagoya, "A new method to express functional permissibilities for LUT based FPGAs and its applications;" in *Proc. of IEEE International Conference on Computer-Aided Design*, pp. 254-61, November 1996, they have been applied in the context of multi-level combinational network synthesis as well, R. Brayton, "Understanding SPFDs: A new method for specifying flexibility," in *Proc. of the International Workshop on Logic Synthesis*, (Tahoe City, Calif.), May 1997 and S. Sinha and R. Brayton, "Implementation and use of SPFDs in optimizing boolean networks," in *Proc. of IEEE International Conference an Computer-Aided Design*, pp. 103-10, November 1998. They have been generalized to multi-valued variables R. Brayton, Supra. and S. Khatri, S. Sinha, R. Brayton, and A. Sangiovanni-Vincentelli, "SPFD-based wire removal in standard-cell and network-of-PLA circuits," *IEEE Trans. on Computer-Aided Design of Integrated Circuits and Systems*, vol. 23, pp. 1020-1030, July 2004 as well as to sequential synthesis S. Sinha, A. Kuehlmann, and R. Brayton, "Sequential SPFDs," in *Proc. of IEEE International Conference on Computer-Aided Design*, pp. 84-90, November 2001. More recently, SPFDs have been applied to the problem of topologically constrained logic synthesis S. Sinha, A. Mishchenko, and R. Brayton, "Topologically constrained logic synthesis;" in *Proc. of IEEE International Conference on Computer-Aided Design*, pp. 679-686, November 2002.

A toggle is simply an SPFD edge. Therefore, both SPFDs and TEQLS use an "optimization as communication" paradigm. By replacing subcircuits $N^i$ with their toggle equivalent counterparts $N^{i*}$, TEQLS essentially "redistributes" complexity between these subcircuits. In other words, subcircuits "talk" to each other through particular choices of encodings. A similar paradigm is used in the method of SPFDs.

One difference between TEQLS and SFPDs is that TEQLS is scalable because there is freedom in choosing the subcircuits to be replaced with their toggle equivalent counterparts and therefore control over sizes. More specifically, TEQLS provides an efficient procedure for finding optimized circuit $N^*$, the essence of which is replacing subcircuits $N^i$ of N with toggle equivalent counterparts $N^{i*}$. The set of candidate circuits is well-defined and huge. To realize how vast the set of candidate circuits is, it suffices to say that the number of k-output functions toggle equivalent to a k-output function $f^i$ (implemented by subcircuit $N^i$) is $(2^k)!$. (Here we assume that all $2^k$ output assignments of $f$ are satisfiable.) This number, for k=1, 2, 3, 4 and 5 is 2, 24, $4 \cdot 10^4$, $2.1 \cdot 10^{13}$ and $2.6 \cdot 10^{35}$ respectively. As a consequence, TEQLS enjoys enormous optimization flexibility even if the subcircuits $N^i$ are small. Unfortunately, the TEQLS references do not provide a procedure that, given a subcircuit $N^i$, would build a toggle equivalent subcircuit $N^{i*}$.

In contrast, in SFPDs, the propagation of toggles from outputs to inputs is controlled by the topology of the optimized circuit. One shortcoming of SFPDs is that SFPDs start with the desired functional requirement (SFPD edges) at the outputs and propagates them backwards towards the inputs, while constructing the multi-level logic in the process. As a result, SPFDs are limited in the choice of candidate circuits by the topology of the original circuit.

Thus, there has been a need for a procedure to build a toggle equivalent subcircuit. The present invention meets this need.

SUMMARY OF THE INVENTION

In one aspect, an embodiment of the present invention provides an improved procedure to build a toggle equivalent circuit. This procedure is referred to herein as the TEP procedure where TEP stands for Toggle Equivalence Preserving. The TEP procedure produces circuit $N^{i*}$ given $N^i$, in a manner that is agnostic about the structure of $N^i$. This is a significant difference compared to existing multi-level synthesis approaches, which retain the original circuit structure to a large extent. The TEP method constructs $N^{i*}$ incrementally, proceeding in a topological manner from inputs to outputs. In any step j of the TEP procedure, the invariant that is satisfied is that the number of toggles of the circuit produced after step j is strictly less than the number of toggles of the circuit after step j−1. Hence convergence is guaranteed, in spite of the TEP procedure exploring a vast optimization space.

BRIEF DESCRIPTION OF THE DRAWINGS

FIGS. 7a-7c are illustrative drawings of toggles eligible to be removed (FIGS. 7a and 7c) and toggles to be reinserted (FIG. 7b) in the course of the construction of FIGS. 6a-6e.

FIGS. 9a-9c are illustrative drawings of toggles eligible to be removed in the course of the construction of FIGS. 8a-8f.

DETAILED DESCRIPTION OF THE PREFERRED EMBODIMENTS

Figure 1:
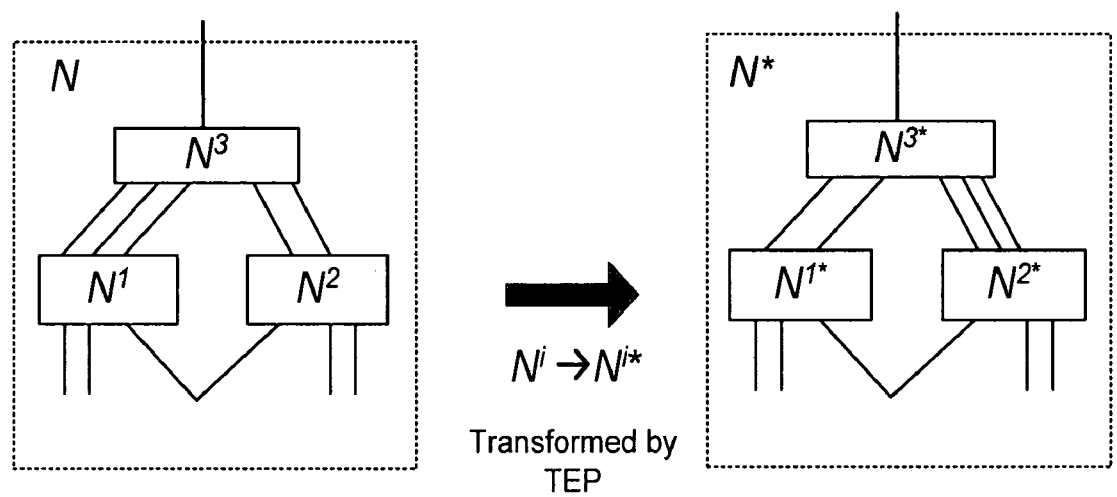
FIG. 1 is an illustrative diagram of a circuit N and a second circuit N*, which is an optimization of circuit N in accordance with a TEQLS procedure; the circuit N is partitioned into subcircuits $N^1$, $N^2$ and $N^3$, and the second circuit N* is partitioned into subcircuits $N^{1*}$, $N^{2*}$ and $N^{3*}$.

The following description is presented to enable any person skilled in the art to make and use a system and method for synthesis of a toggle equivalent circuit in accordance with embodiments of the invention, and is provided in the context of particular applications and their requirements. Various modifications to the preferred embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. In other instances, well-known structures and processes are shown in block diagram form in order not to obscure the description of the invention with unnecessary detail. Furthermore, variations of the notation style N1 and N2 are used repeatedly throughout this disclosure to represent different examples of a first circuit N1 and a second circuit N2. In each example, a second circuit N2 is constructed in accordance with an embodiment of the invention to be toggle equivalent to a first circuit N1. Thus, the present invention is not intended to be limited to the embodiments shown, but is to be accorded the widest scope consistent with the principles and features disclosed herein.

Toggle Equivalence of Boolean Functions

This section discusses the notion of toggle equivalence and its properties. All the propositions given in this disclosure are either proven or can be easily derived by a person possessing ordinary skill in the relevant art from the disclosure in commonly assigned U.S. Pat. No. 7,380,226 entitled, Method and Apparatus to Perform Logic Synthesis Preserving High-Level Specification, issued May 27, 2008 invented by E. Goldberg, which is expressly incorporated herein in its entirety by this reference.

Definition 1. Let $f: \{0,1\}^n \rightarrow \{0,1\}^m$ be an m-output Boolean function. A toggle of $f$ is a pair of two different output vectors produced by $f$ for two input vectors. In other words, if $y=f(x)$ and $y'=f(x')$ and $y \neq y'$ then $(y, y')$ is a toggle.

Definition 2. Let $f_1$ and $f_2$ be m-output and k-output Boolean functions of the same set of variables. Functions $f_1$ and $f_2$ are called toggle equivalent if $f_1(x) \neq f_1(x') \Leftrightarrow f_2(x) \neq f_2(x')$. Circuits $N_1$ and $N_2$ implementing toggle equivalent functions $f_1$ and $f_2$ are called toggle equivalent circuits.

Proposition 1. Let $f_1: \{0,1\}^n \to \{0,1\}^m$ and $f_2 \{0,1\}^n \to \{0,1\}^k$ be m-output and k-output Boolean functions of the same set of variables. Let $f_1$ be $f_2$ are toggle equivalent. Then there is an invertible function K such that $f_1(x)=K(f_2(x))$ and $f_2(x)=K^{-1}(f_1(x))$.

Proposition 1 means that if functions $f_1$ and $f_2$ are toggle equivalent, then there is a one-to-one mapping K between the output vectors produced by $f_1$ and $f_2$.

Proposition 2. Let $f_1$ and $f_2$ be toggle equivalent single output Boolean functions. Then $f_1=f_2$ or $f_1=\sim f_2$ where '$\sim$' means negation.

Let $N_1$ and $N_2$ be toggle equivalent functions. Definition 3, Definition 4, and Proposition 3 below explain how one can implicitly find the mapping K relating outputs produced by $N_1$ and $N_2$.

Definition 3. Let $f$ be a Boolean function. We will say that functions $f^*$ is obtained from $f$ by existentially quantifying away variable x if $f^* = f(\ldots, x=0, \ldots) \vee f(\ldots, x=1, \ldots)$.

Definition 4. Let N be a circuit. Denote by v(N) the set of variables of N. Denote by Sat(v(N)) the Boolean function such that Sat(z)=1 if the assignment z to v(N) is "possible" i.e. consistent. For example, if N consists of just one AND gate $y=x_1 \hat{} x_2$, then $Sat(v(N))=(\sim x_1 \vee \sim x_2 \vee y) \hat{} (x_2 \vee \sim y) \hat{} (x_2 \vee \sim y)$. For the sake of simplicity, we will denote Sat(v(N)) as just Sat(N).

Proposition 3. Let $N_1$ and $N_2$ be toggle equivalent and $A_1$, $A_2$ be the sets of their output variables. Let function $K^*(A_1, A_2)$ be obtained from $Sat(v(N_1)) \hat{} Sat(v(N_2))$ by existentially quantifying away the variables of $v(N_1) \cup v(N_2)$ except those of $A_1 \tilde{A} A_2$. The function $K^*(A_1,A_2)$ implicitly specifies the one-to-one mapping K between output vectors produced by $N_1$ and $N_2$.

Implication of Toggling

This section describes the notion of implication of toggling and describes how toggle equivalence and implication of toggling can be tested.

Definition 5. Let $f_1$ and $f_2$ be two multi-output functions with the same set of variables $X=\{x_1, \ldots, x_n\}$. Function $f_1$ implies toggling of $f_2$, if for any pair of assignments x', x" to the variables of X, $f_1(x') \neq f_1(x")$ implies $f_2(x') \neq f_2(x")$. (In other words, toggling of $f_1$ implies that of $f_2$.)

Definition 6. A multi-output function $f_1(x_1, \ldots, x_n)$ strictly implies toggling of a multi-output function $f_2(x_1, \ldots, X_n)$ if $f_1$ implies toggling of $f_2$ and there is a pair of assignments x', x" to the variables of X such that $f_1(x')=f_1(x")$ while $f_2(x') \neq f_2(x")$.

Remark 1. The notation $f_1 \leq f_2$ (respectively $f_1 < f_2$) denotes the fact that function $f_1$ implies toggling of (respectively strictly implies toggling of) $f_2$. The notation $N_1 \leq N_2$ (respectively $N_1 < N_2$) denotes the fact that the function implemented by Boolean circuit $N_1$ implies toggling of (respectively strictly implies toggling of) the function implemented by Boolean circuit $N_2$. In other words, by strictly implies toggling it is meant that there is a toggle implication in only one direction, e.g. toggling of $N_1$ implies toggling of $N_2$ but not vise versa.

Proposition 4. Boolean functions $f_1$ and $f_2$ are toggle equivalent if $f_1 \leq f_2$ and $f_2 \leq f_1$.

Testing for Implication of Toggling

Let $N_a$ and $N_b$ be two Boolean circuits to be checked for implication of toggling. Let X be the set of input variables of $N_a$ and $N_b$, while $Y_a$ and $Y_b$ are respectively the sets of variables of $N_a$ and $N_b$. Let $Z_a$ and $Z_b$ be the sets of output variables of $N_a$ and $N_b$ respectively. Also, assume $N^*_a$ and $N^*_b$ are copies of $N_a$ and $N_b$, with output variables $Y^*_a$ and $Y^*_b$ respectively, and input variables $X^*$. Then $N_a \leq N_b$ holds if and only if the function $S(N_a, N_b)$ is unsatisfiable, where $$S(N_a, N_b) = (SAT(N_a)) \cdot (SAT(N^*_a) \cdot SAT(N^*_b)) \cdot (Y_a = Y^*_a) \cdot (Y_b = Y^*_b)$$

Based on this, we can make two comments.

To test if $N_a \leq N_b$, we simply test the satisfiability of $S(N_a, N_b)$ i.e. we test if $S(N_a, N_b)$ evaluates to 1 If $S(N_a, N_b)$ is a constant zero (unsatisfiable), we conclude that $N_a \leq N_b$.

If $S(N_a, N_b)$ is satisfiable, it means that there exists at least a pair of input vectors x and x* for which circuit $N_a$ toggles, while $N_b$ does not. If we remove all such toggles from $N_a$, then we would have $N_a \leq N_b$.

In other words, given two networks, $N_a$ and $N_b$, we can define a function find_toggle_setdifference $(N_a, N_b)$=ALL-SAT $(S(N_a, N_b))$ which returns toggles of $N_a$ that are not matched by toggles of $N_b$. This is the set of toggles that must be removed from $N_a$. If the resulting set ALLSAT $(N_a, N_b)$ is too large, a manageable subset is used.

We use the two comments above as the core of two routines—one of which tests for toggle implication and another which returns the toggles that must be removed before toggle implication can be guaranteed.

From Proposition 4, it follows that checking for toggle equivalence reduces to two satisfiability checks (henceforth called SAT checks).

Correlation Function

This section describes the notion of correlation function to extend definitions of toggle implication and toggle equivalence to the case when functions $f_1$ and $f_2$ have different sets of variables.

Definition 7. Let X and Y be two disjoint sets of Boolean variables (the number of variables in X and Y may be different). A function $Cf(X, Y)$ is called a correlation function if there are subsets $Q^X \subseteq \{0,1\}^{|X|}$ and $Q^Y \subseteq \{0,1\}^{|Y|}$ such that $Cf(X,Y)$ specifies a bijective mapping $M: Q^X \to Q^Y$ Namely $Cf(x, y)=1$ if $x \in Q^X$ and $y \in Q^Y$ and $y=M(x)$. (A mapping M of a set A to set B is called bijective if the following two conditions hold. First, $a_1 \neq a_2$ where $a_1, a_2 \in A$ implies $M(a_1) \neq M(a_2)$. Second, for every element $b \in B$ there is an element $a \in A$ such that $M(a)=b$.

Informally, $Cf(X,Y)$ is a correlation function if it specifies a bijective mapping between a subset $Q^X$ of $\{0,1\}^{|X|}$ and a subset $Q^Y$ of $\{0,1\}^{|Y|}$.

Let $f_1(X)$ and $f_2(Y)$ be two multi-output Boolean functions where $X=\{x_1, \ldots, x_k\}$ and $Y=\{y_1, \ldots, y_p\}$ are sets of their variables. (Note, that $f_1$ and $f_2$ may have different number of variables.). Let $Cf(X, Y)$ be a correlation function relating variables of $f_1$ and $f_2$. Then one can introduce notions of toggle equivalence and toggle implication for $f_1$ and $f_2$. The only difference from definitions and results listed in previous four sections is that now one should consider only assignments that satisfy $Cf(X,Y)$.

For example, $f_1$ and $f_2$ are said to be toggle equivalent, if for any pair of pairs (x, y) and (x',y') of input vectors such that $Cf(x, y)=Cf(x',y')=1$, it is true that $f_1(x) \neq f_1(x') \Leftrightarrow f_2(y) \neq f_2(Y')$. The mapping between output vectors produced by toggle equivalent circuits $N_1$ and $N_2$ (implementing functions $f_1$ and $f_2$ respectively), can be obtained from $Sat(v(N_1))\widehat{\ }Sat(v(N_2))\widehat{\ }Cf(X,Y)$ by existentially quantifying away all the variables of $v(N_1) \cup v(N_2)$ except output variables of $N_1$ and $N_2$. The other results and definitions of previous four sections can be modified in a similar manner.

Toggle Equivalence Preserving Logic Synthesis (TEQLS)

This section describes a procedure of Toggle Equivalence preserving Logic Synthesis (TEQLS) introduced in the above-identified commonly owned U.S. Patent Application, which is expressly incorporated by reference. The pseudocode of the TEQLS procedure is shown below. The pseudocode is representative of computer readable code that may be encoded in a computer readable storage medium and that may be used to instruct a computer to perform the TEQLS procedure.

---
Pseudocode of TEQLS procedure

```
1  Synthesize(N, Partition(N),cost_function) {
2    for(i=1; i <= k; i++) {
3      Cf_inp(N^i, N^i*)= correlation_func(N,N*,i);
4      N^i* = synth_toggle_equivalent(N^i, Cf_inp,cost_function)
5      Cf_out(N^i, N^i*) = exist_quantify(N^i,N^i*, Cf_inp); }
6    return(N*,Partition(N*))}
```
---

It is assumed that Partition(N)={N', ..., $N^k$} (i.e. the initial partition of circuit N into subcircuits $N^i$) is topological. (Let G be a directed graph whose nodes are subcircuits $N^i$ and an edge of G directed from node $N^i$ to node $N^j$ implies that an output of $N^i$ is connected to an input of $N^j$. Partition(N) is called topological if G is acyclic.) Since Partition(N) is topological, one can assign levels to subcircuits $N^i$. It is further assumed that if i<j then topological_level($N^i$)≦topological_level($N^j$). In other words, subcircuits $N^i$, i=1, . . . ,k are processed by the TEQLS procedure in topological order, from inputs to outputs.

Consider, for example, how the TEQLS procedure works by the example of FIG. 1. The procedure starts with subcircuit $N^1$ and recover the correlation function $Cf_{inp}(N^1, N^{1*})$ relating inputs of $N^1$ and $N^{1*}$ to be built (line 3 of the pseudocode). The inputs of $N^1$ are inputs of N (and so $N^1$ has the lowest topological level 1). In that case, the correlation function is just a conjunction of equality functions relating corresponding inputs of $N^1$ and $N^{1*}$. (This correlation function just "identifies" the corresponding inputs of $N^1$ and $N^{1*}$.) Then an actual subcircuit $N^{1*}$ toggle equivalent to $N^1$ is synthesized (line 4). In the end of this iteration, the function $Cf_{out}(N^1, N^{1*})$ relating outputs of $N^1$ and $N^{1*}$ is built (line 5) as described in Proposition 3. Since $N^1$ and $N^{1*}$ are toggle equivalent, there is a one-to-one mapping between the output vectors they produce. So $Cf_{out}(N^1, N^{1*})$ is a correlation function.

Correlation functions are explained in the above—identified commonly owned patent application, which describes a relation among the outputs of toggle equivalent circuits $N^i$ and $N^{i*}$ as a correlation function. This relation can be obtained from the function $SAT(N^i)\widehat{\ }SAT(N^{i*})\widehat{\ }Cf(N^i, N^{i*})$ by existentially quantifying away all the variables except output variables of $N^i$ and $N^i$. Therefore, computation of the correlation function relating outputs of $N^i$ and $N^{i*}$ is readily reproducible.

Then, the TEQLS procedure processes subcircuit $N^2$ in the same manner, generating a toggle equivalent subcircuit $N^{2*}$ and the correlation function $Cf_{out}(N^2, N^{2*})$. Finally, the subcircuit $N^3$ is processed similarly to $N^1$ and $N^2$ with one exception. The inputs of $N^3$ are fed by the outputs of $N^1$ and $N^2$. So now the correlation function $Cf_{inp}(N^3, N^{3*})$ relating inputs of $N^3$ and subcircuit $N^{3*}$ (synthesized in line 4) equals $Cf_{out}(N^1, N^{1*})\widehat{\ }Cf_{out}(N^2, N^{2*})$. (The conjunction of $Cf_{out}(N^1, N^{1*})$ and $Cf_{out}(N^2,N^{2*})$ is taken because outputs of $N^1$ and $N^2$ feed inputs of $N^3$). It is not difficult to show that a conjunction of correlation functions is a correlation function too. (So $Cf_{inp}(N^3, N^{3*})$ is a correlation function indeed.)

Since $N^3$ has only one output, subcircuits $N^3$ and $N^{3*}$ (under constraints on input assignments specified by $Cf_{inp}(N^3, N^{3*})$) are functionally equivalent modulo complement. So the circuit N* consisting of subcircuits $N^{1*}, N^{2*}, N^{3*}$ is functionally equivalent to N (modulo complement).

A procedure for Building a Toggle Equivalent Circuit

Figure 2:
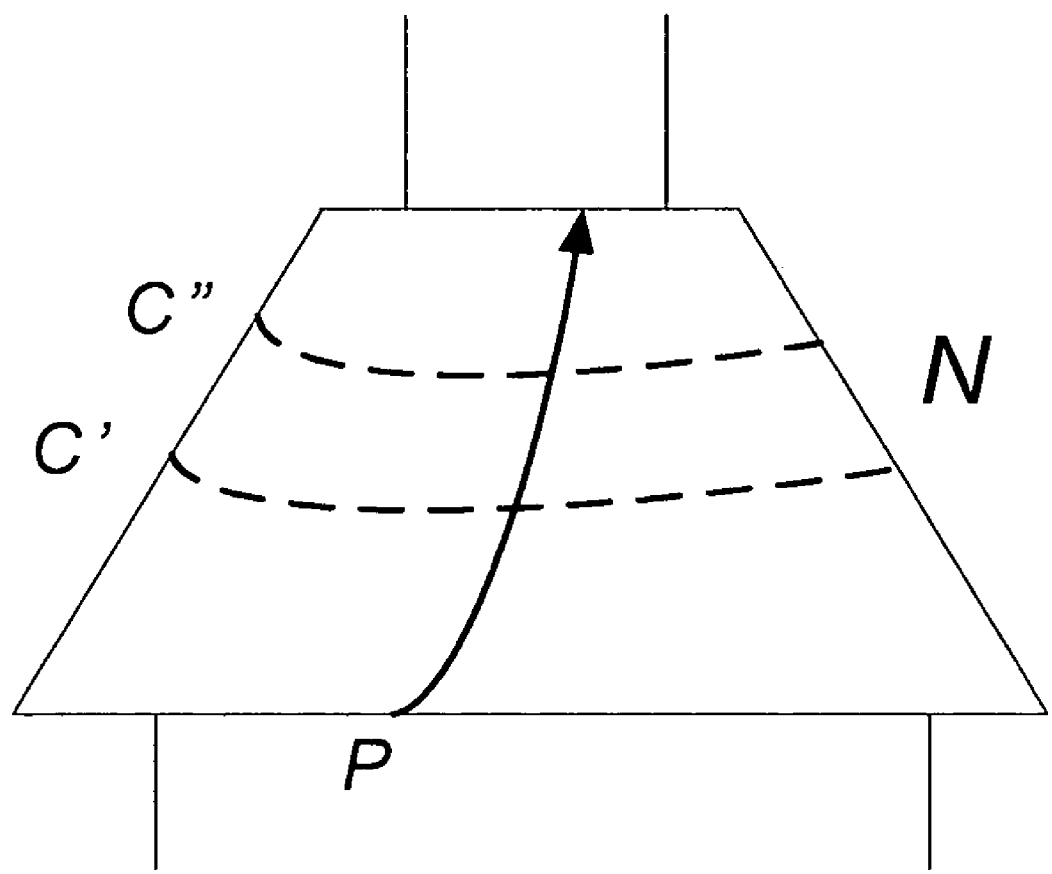
FIG. 2 is an illustrative drawing of a Boolean circuit N with a sequence of topologically ordered circuit cuts C' and C".

This section describes a toggle equivalence preserving (TEP) procedure (used in line 4 of the TEQLS procedure above) in accordance with an embodiment of the invention. Given a subcircuit $N^i$ and correlation function $Cf_{inp}$ relating inputs of $N^i$ and a future subcircuit $N^{i*}$, the TEP procedure actually builds $N^{i*}$ that is toggle equivalent to $N^i$. For the sake of simplicity, in this section, the superscript i is dropped from $N^i, N^{i*}$. Moreover, it is assumed that $N^i$ and $N^{i*}$ have identical sets of input variables. Thus, there is no need for a correlation function to relate the inputs. The extension to the case of different input variables related by a correlation function can be easily done as described in the section "correlation function". Assume for example, that one needs to check an expression E for satisfiability (in the case when $N^i$ and $N^{i*}$ had identical input variables). The extention to the case when $N^i$ and $N^{i*}$ have different input variables is done by checking the satisfiability of the expression $E\widehat{\ }Cf(N^i, N^{i*})$ where $Cf(N^i, N^{i*})$ is a correlation function relating input variables of $N^i$ and $N^{i*}$ The TEP procedure is based on the following observation. Referring to FIG. 2, suppose that N is a Boolean circuit and C' and C" are two "topologically ordered" cuts. Namely, no path P from an input to an output of N can "cross" C" before C' (but C' and C" may have common points). Let N' and N" be the subcircuits of N consisting of the gates located between the primary inputs and the cut C' or C" respectively. Then N"≦N'. In other words, if for a pair of input vectors a point of C" toggles, there has to be at least one point of C' that toggles too.

Figure 3:
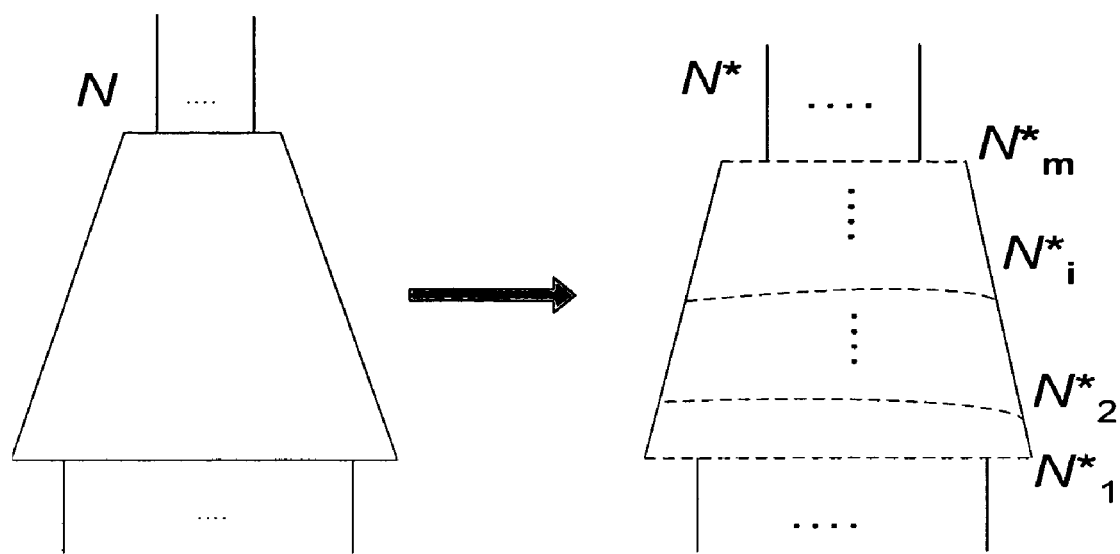
FIG. 3 is an illustrative drawing of a Boolean circuit N and a circuit N* that is toggle equivalent to N and showing a sequence of circuits $N^*_i$, i=1, ..., m built in the course of the construction of circuit N*.

Referring to FIG. 3, let N be a Boolean circuit. To build a circuit N* that is toggle equivalent to N, the TEP procedure constructs a sequence of circuits $N^*_1, \ldots, N^*_m$. $N^*_1$ is an "empty" circuit consisting only of inputs of N while $N^*_m$ is the final circuit N* that is toggle equivalent to N. Circuits are built in such a way that for each $N^*_i$, i=2, . . . , m the following invariant holds: $N \leq N^*_i \leq N^*_{i-1}$. Informally speaking, every circuit $N^*_1$ toggles at least as much as N and strictly less than all the circuits $N^*_j$, j<i. That $N \leq N^*_1$, trivially follows from the fact that the set of inputs of N forms a cut of N. Since every next circuit $N^*_i$ "looses" a toggle in comparison to $N^*_{i-1}$, the sequence $N^*_1, \ldots, N^*_m$ eventually converges to a circuit N* toggle equivalent to N.

Pseudocode of a TEP procedure in accordance with an embodiment of the invention is shown below. The pseudocode is representative of computer readable code that may be encoded in a computer readable storage medium and that may be used to instruct a computer to implement the TEP procedure.

---
Pseudocode of TEP procedure
---
```
generate_toggle_equivalent_circuit(N) {
1   if (constant(N)) return('constant');
2   N^curr = Ø;
3   while (true) {
4       if(N^curr ≦ N)   return(N^curr);
5       N^curr = discard_toggles(N^curr, N)
6       N^curr = remove_redundant_outputs(N^curr); }
```
---

The sequence of circuits mentioned above is built in a loop (lines 3-6). This sequence starts with an "empty" circuit $N^{curr}$ (line 2). In the loop, first, it is checked if $N^{curr} \leq N$ holds. If so, then $N^{curr}$ is toggle equivalent to N (because $N \leq N^{curr}$ by construction). Otherwise, a new circuit $N^{curr}$ is generated by the function discard_toggles (line 5) such that $N \leq N^{curr(new)} < N^{curr(old)}$. Finally, redundant outputs of $N^{curr}$ are removed (line 6). (An output of $N^{curr}$ is redundant if after its removal from $N^{curr}$, the inequality $N \leq N^{curr}$ still holds.)

Pseudocode of a discard_toggles process in accordance with an embodiment of the invention is shown below. The pseudocode is representative of computer readable code that may be encoded in a computer readable storage medium and that may be used to instruct a computer to implement the discard toggles procedure.

---
Pseudocode of discard_toggles
---
```
discard_toggles(N^curr, N) {
1   R* = toggle_diference (N^curr, N); /* N^curr ≦ N ? */
2   (N', R) = remove_toggles(R*, N^curr);
3   D = toggle_diference(N, N'); /* N ≦ N' ? */
4   N" = add_toggles(R, D, N', N^curr);
5   return(N");}
```
---

This procedure returns circuit N" such that $N \leq N'' < N^{curr}$. The circuit N" is built in two steps. First, a circuit N' such that $N' < N^{curr}$ is obtained from $N^{curr}$ (lines 1-2). At this point, the inequality $N \leq N'$ may not hold. Second, the circuit N' is transformed into the final circuit N" (lines 3-4).

Figures 4A, 4B:
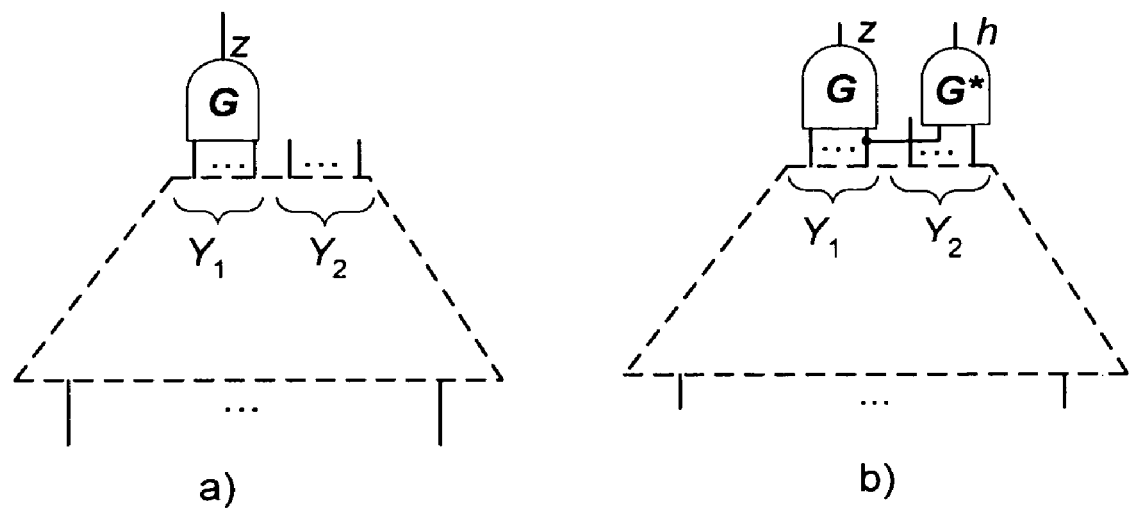
FIGS. 4a–4b are illustrative drawings showing an example of toggle removal through the addition of a logic gate and showing an example of toggle addition though the addition of a logic gate.

In line 1, the set R* of "redundant" toggles of $N^{curr}$ is computed. As was mentioned in Section Testing for implication of toggling, checking if $N^{curr} \leq N$ reduces to testing the satisfiability of the function S defined there. To find the redundant toggles of $N^{curr}$ one needs to enumerate all the assignments satisfying S. (However if the set R* is too large one can use a manageable subset of R*.) The function remove_toggles produces circuit N' by adding an AND gate to $N^{curr}$. It also computes a subset R of R* consisting of the toggles that are actually removed after adding the AND gate above. The idea of toggle removal is illustrated in FIG. 4a.

Let Y be the set of output variables of $N^{curr}$. Let $t_1=(y, y')$ be a toggle of $N^{curr}$ from R*. Let $Y_1$ (respectively $Y_2$) be the subset of Y corresponding to the components of y and y' that are different (respectively identical). That is $Y_1$ ($Y_2$) correspond to the toggling (non-toggling) outputs of $N^{curr}$. Then one can always add an AND gate G (see FIG. 4a) whose inputs are fed by the outputs $Y_1$ of $N^{curr}$ such that G(y)=G(y'). Then the circuit N' (obtained from $N^{curr}$ after adding G) with the set of output variables $\{z\} \cup Y_2$ (here z specifies the output of G) does not toggle for any pair of input vectors producing the toggle $t_1=(y, y')$ in $N^{curr}$.

Unfortunately, adding gate G may remove some "useful" toggles. (A toggle of N' is useful if its removal breaks inequality $N \leq N'$.) So, there is a need to reintroduce useful toggles by adding gates to the circuit N' and transforming it into a circuit N". The set D of toggles to be reintroduced is computed by the same function toggle_difference (line 3). However, in contrast to R*, the set D has to be computed exactly (to guarantee that $N \leq N''$.) Let toggle $t_2=(h,h')$ be a useful toggle of $N^{curr}$ removed from N'. The set of outputs of $N^{curr}$ toggling in $t_2$ is a subset of the set $Y_1$. (If an output of $Y_2$ toggled in $t_2$, then any pair of input vectors producing toggle $t_2$ in $N^{curr}$ would make N' toggle too.) Referring to FIG. 4b, that one can reintroduce the toggle $t_2$ of the set D by adding an AND gate, without reintroducing a toggle $t_1$ of R. In other words, the discard_toggles procedure returns a circuit N" (that becomes new $N^{curr}$) such that $N \leq N'' < N^{curr}$.

Procedures remove_toggles and add_toggles are heuristic. remove_toggles picks a gate that removes a maximal set R of toggles from R*. add_toggles picks an AND gate so as to minimize the number of reintroduced toggles of R while maximizing the number of reintroduced toggles of D. add_toggles keeps adding gates (using the same cost function) until all toggles of D are reintroduced.

Figure 5:
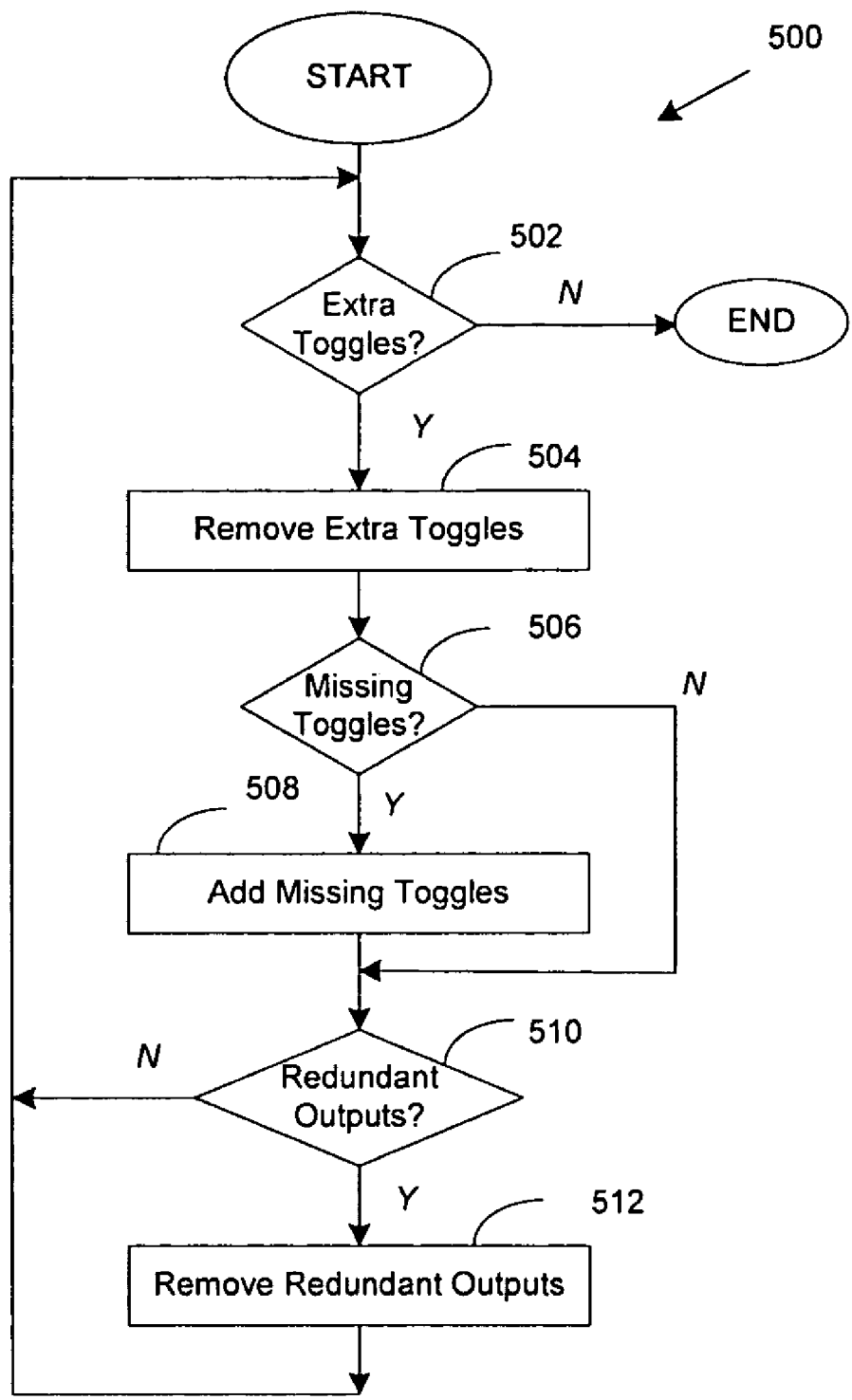
FIG. 5 is an illustrative flow diagram of a toggle equivalence preserving (TEP) logic synthesis procedure in accordance with an embodiment of the invention.

FIG. 5 is an illustrative flow diagram of a toggle equivalence preserving logic synthesis process 500 in accordance with an embodiment of the invention. The process of FIG. 5 may be implemented using computer program code comprising the functional blocks described below. The process incrementally builds up a second circuit (not shown) so as to evolve it to become a toggle equivalent of a first circuit (not shown). In block 502 a determination is made as to whether one or more toggles exist that occur in the second circuit that do not occur in the first circuit. In one embodiment of the invention, the determination in block 502 involves a satisfiability (SAT) check. Alternatively, the determination may involve the use of Binary Decision Diagrams (BDDs) for example. If there are no toggles that occur in the second circuit that do not also occur in the first circuit, then the second circuit is determined to be toggle equivalent to the first circuit and the process terminates. If one or more extra toggles in the second circuit are identified in block 502 in the second circuit that do not occur in the first circuit, then in block 504, at least one of the extra toggles identified in block 502 is removed through the addition of at least one circuit element to the second circuit.

In block 506, a determination is made as to whether one or more toggles exist that occur in the first circuit that do not occur in the second circuit. In one embodiment of the invention, the determination in block 504 involves a satisfiability (SAT) check. Alternatively, the determination may involve the use of Binary Decision Diagrams (BDDs) for example. If one or more toggles missing from the second circuit is identified in block 506 in the first circuit that do not occur in the second circuit, then in block 508, each missing toggle identified in block 506 is added to the second circuit through the addition of at least one circuit element to the second circuit. The circuit element added in block 508 is selected so as to not add back one or more toggles that was removed in block 504. If no toggles are identified for removal in block 506, then the process proceeds to block 510.

In block 510, a determination is made as to whether there are outputs of the second circuit that are redundant. In one embodiment of the invention, the determination in block 510 involves a satisfiability (SAT) check. Alternatively, the determination may involve the use of Binary Decision Diagrams (BDDs) for example. If in block 510, one or more outputs of the second circuit is determined to be redundant, then in block 512, the redundant outputs are removed from the second circuit. If in block 510, no output is determined to be redundant, the process proceeds to block 502.

A toggle equivalence preserving logic synthesis process in accordance with the invention will be better understood from the following illustrative examples.

EXAMPLE 1

Figure 6A:
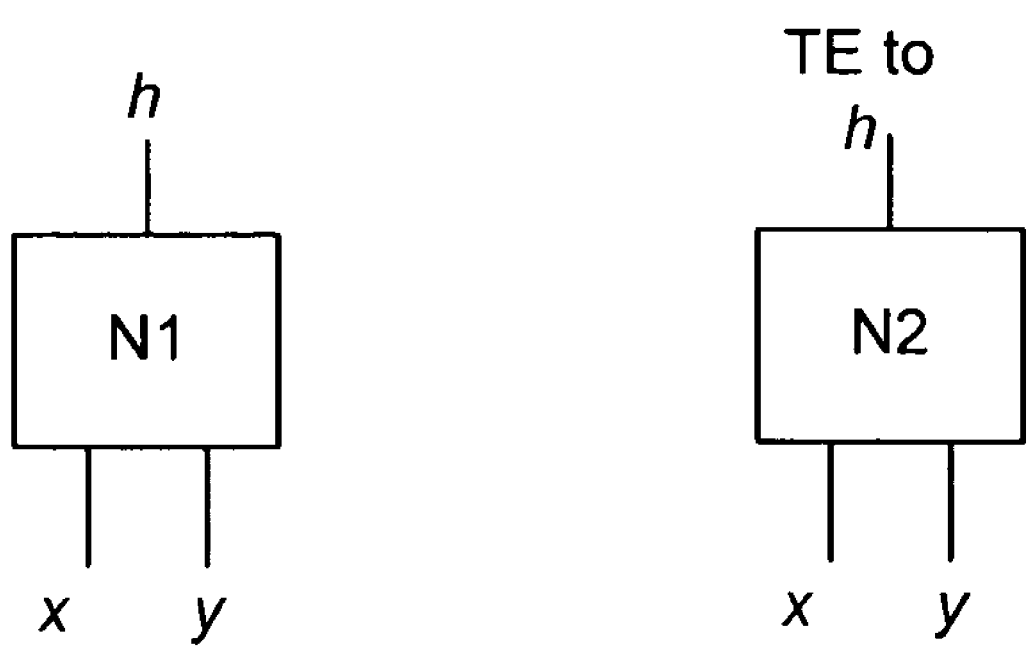
FIGS. 6a-6e are illustrative drawings showing construction of a circuit N2 that is toggle equivalent to circuit N1 in accordance with the TEP of FIG. 5.

FIGS. 6a-6e show a sequence of subcircuits $N_2^i$ created in the course of developing a second circuit $N_2$ that is toggle equivalent to a first circuit $N_1$. FIG. 6a is an illustrative drawing of the first circuit $N_1$ and the second circuit $N_2$. The first circuit $N_1$ has inputs x and y and output h. In this example, the first circuit $N_1$ implements a logical function $h=\sim x\hat{\ }\sim y \vee x\hat{\ }y$, where $\sim$ represents the complement function. The second circuit $N_2$ is created in accordance with an embodiment of the invention to behave as a toggle equivalent to the first circuit $N_1$. As explained above, a toggle is an output sequence pair in which at least one output value changes, i.e. it 'toggles'.

As an aside, we note that if $O_1$ and $O_2$ are two different output assignments produced by a circuit N (and so the pair $O_1$, $O_2$ is a toggle), they can be produced only by different input assignments $I_1$ and $I_2$ applied to N. (In other words if $N(I_1)=O_1$ and $N(I_2)=O_2$ then $O_1 \neq O_2$ implies that $I_1 \neq I_2$. However, this implication does not work in the other direction, that is $I_1 \neq I_2$ does not imply that $N(I_1) \neq N(I_2)$). Thus, in general, there may exist many inputs pairs $I_1$, $I_2$ that produce the same output assignments $O_1$ and $O_2$.

Figure 6B:
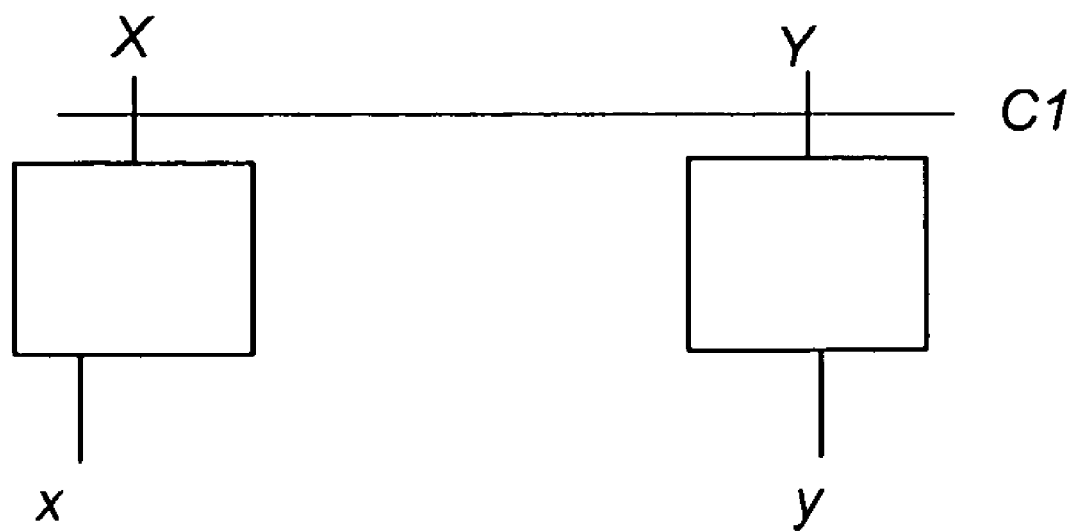

Returning now to the main discussion, FIG. 6b shows a first subcircuit $N_2^1$ that consists of buffers on inputs x and y, with outputs X and Y respectively. In the first subcircuit $N_2^1$, X=x, Y=y; the inputs are x and y; and the outputs are X and Y. The first subcircuit $N_2^1$ has two outputs X and Y, which define a first cut $C_1$.

Figure 7A:
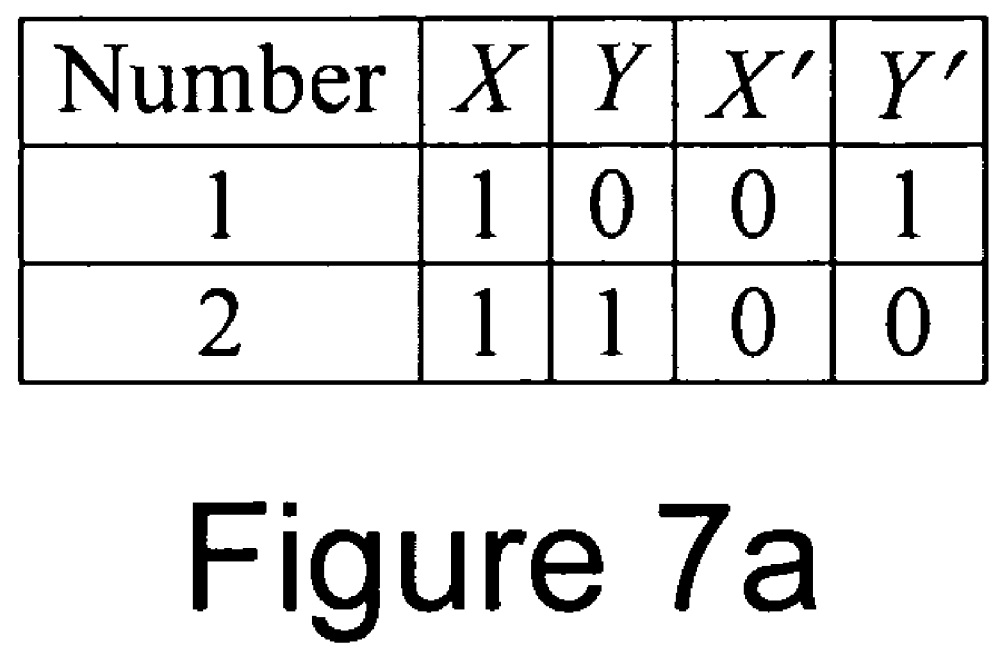

FIG. 7a is an illustrative chart showing a set of toggles $R_2^1$ of the first subcircuit $N_2^1$ that are determined to be candidates for removal because the first circuit $N_1$ does not have corresponding toggles. In this example, symmetric toggles (X,Y), (X',Y') and (X',Y', X, Y) are counted as one. In the chart of FIG. 7a, X and Y represent one set of output values, and X' and Y' represent another set of output values. In other words, the first toggle of the candidate for removal set $R_2^1$, represents a toggle in which output values for the outputs X and Y defining the first cut $C_1$, change between (X=1, Y=0) and (X'=0, Y'=1). More particularly, in the first toggle to be removed, the value of output X toggles between X=1 and X'=0, and the value of output Y toggles between Y=0 and Y'=1.

For instance, assume that an (x, y) input sequence pair (x=1, y=0) followed by (x=0, y=1) is applied to both the first circuit $N_1$ and to the first subcircuit $N_2^1$. The corresponding (X,Y) output sequence pair of the first subcircuit $N_2^1$ is, (X=1, Y=0) followed by (X=0, Y=1). This is the output sequence pair for the first toggle of the set $R_2^1$. However, for that same input sequence pair, the output h of the first circuit $N_1$ does not toggle, since both the input combination (x=1, y=0) and the input combination (x=0, y=1) result in h=0. Thus, the first toggle is identified as a candidate for removal.

The set of toggles $R_2^1$, which is the set of candidates for removal is identified through a test for implication of toggling. Basically, there is a check to determine whether output toggling of a circuit $N_1$ implies toggling of a circuit $N_2^1$. This check can be accomplished, for example, through a SAT-check. According to such approach, toggling of $N_1$ implies that of $N_2^1$ if a function S (defined for the SAT-check) is unsatisfiable. If S is satisfiable, then every assignment of variables satisfying S (i.e. setting S to 1) specifies a toggle of $N_1$ that is not in $N_2^1$. (This means that toggling of $N_1$ does not imply that of $N_2^1$).

Figure 6C:
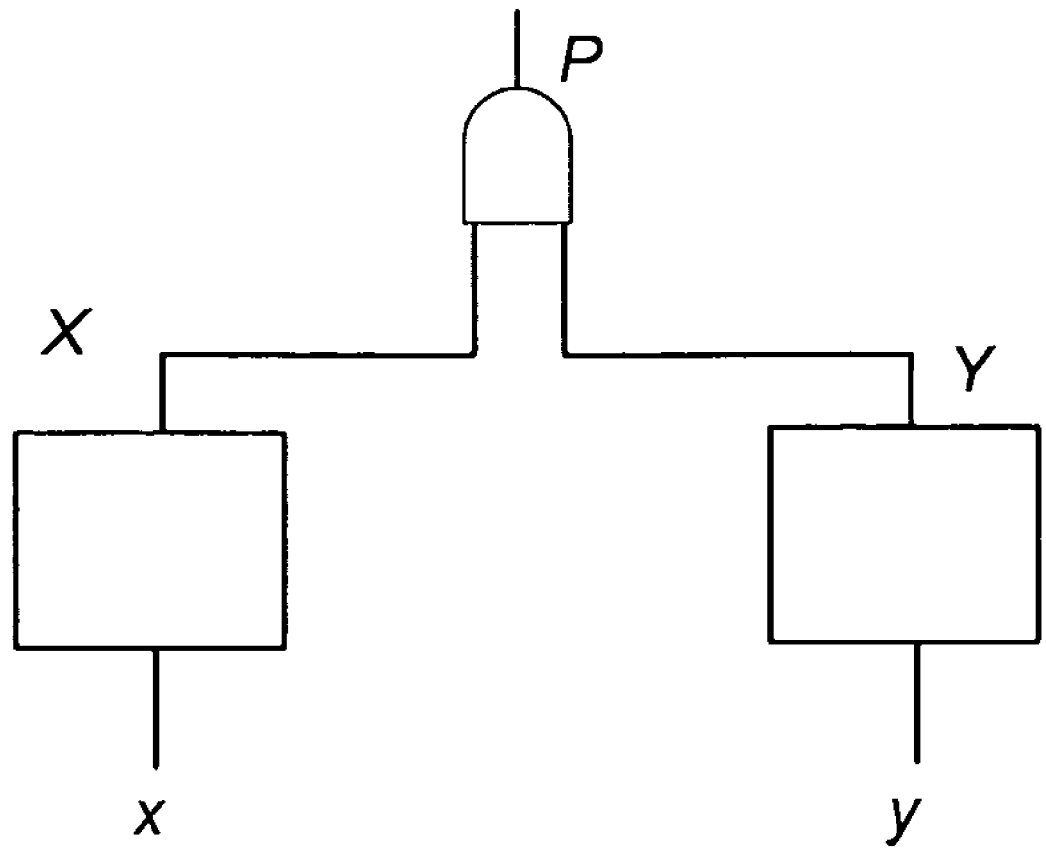

FIG. 6c is an illustrative drawing showing insertion of a first logic element so as to remove a toggle from the set $R_2^1$ of the first subcircuit $N_2^1$ and so as to produce a first intermediate subcircuit $N_2^{1*}$. In this example, the first logic element is an AND gate having output P. The output P defines a first intermediate cut $C_1^*$. X and Y are not part of the first intermediate cut $C_1^*$. Thus, the first logic element implements the logic function $P=x\hat{\ }y$. Assuming occurrence of the first toggle in the set $R_2^1$ in FIG. 7a, the occurrence of the output sequence pair, (X=1,Y=0) followed by (X=0, Y=1) results in a value of P=0 for (X=1, Y=0) followed by P=0 for (X=0, Y=1). In other words, the value of P does not change. Therefore, insertion of the first logic element has the effect of removing the first toggle in the set $R_2^1$ of FIG. 7a. Thus, the first intermediate subcircuit $N_2^{1*}$ does not include the removed first toggle of that set $R_2^1$.

It will be noted that only a single toggle is removed at this stage even though multiple candidates for removal are identified in FIG. 7a. The removal of at least one toggle ensures that there is convergence of the second subcircuit $N_2^i$ upon toggle equivalence to the first circuit $N_1$. However, by removing fewer than all of the toggles eligible for removal, there is a greater likelihood that such removal will be achieved without loss of information, i.e. without loss from the second subcircuit $N_2^i$ of toggles that are present in the first circuit $N_1$. Thus, toggles are removed gradually so as to avoid information loss of toggle information along the way. It will be appreciated, however, that even limiting the number of toggles removed from subcircuit $N_2^i$ at each stage may not prevent loss of some toggle information. Some removed toggles may have to be reintroduced to subcircuit $N_2^i$ in order to ensure convergence toward toggle equivalence.

Figure 7B:
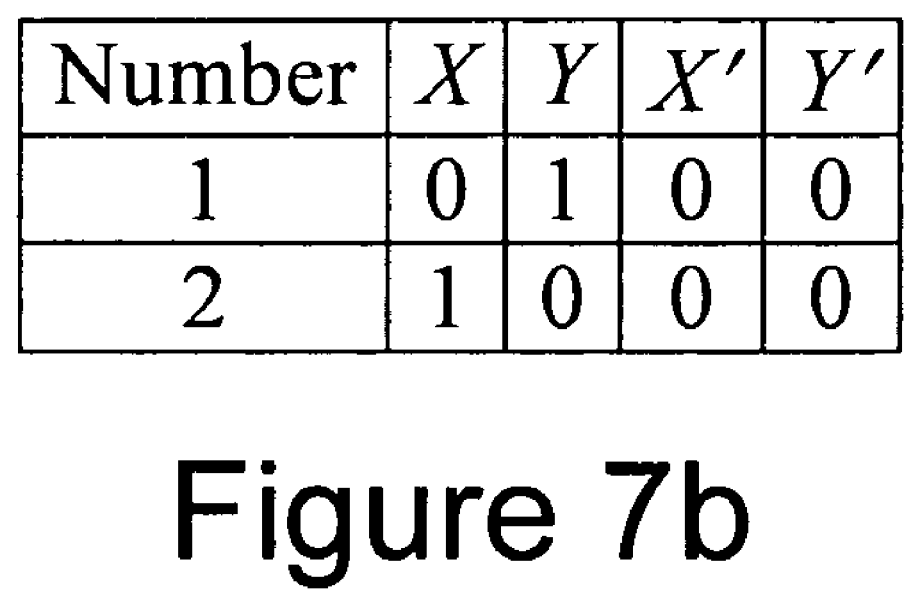

FIG. 7b is an illustrative chart showing a set of toggles $D_2^1$ to be reintroduced to the first intermediate subcircuit $N_2^{1*}$. Assume that in this example, the addition of the first logic element has the effect of removing toggles that occur in the first subcircuit $N_2^1$ and that also occur in the first circuit $N_1$. In other words, assume for example, that the first and second toggles in the chart of FIG. 7b occur in both the first circuit $N_1$ and first subcircuit $N_2^1$, and that both of these toggles are absent from the first intermediate subcircuit $N_2^{1*}$ due to the addition of the first logic element. For example, the occurrence in the first intermediate subcircuit $N_2^{1*}$ of the input sequence pair (x, y) values (x=0, y=1) followed by values (x=0, y=0) results in a value of P=0 for (x=0, y=1) followed by P=0 for (x=0, y=0). However, this same input sequence pair of (x, y) results in h=0 for (x=0, y=1) followed by h=1 for (x=0, y=0). Thus, the first intermediate subcircuit $N_2^{1*}$ lacks a toggle that occurs in the first circuit $N_1$.

Figure 6D:
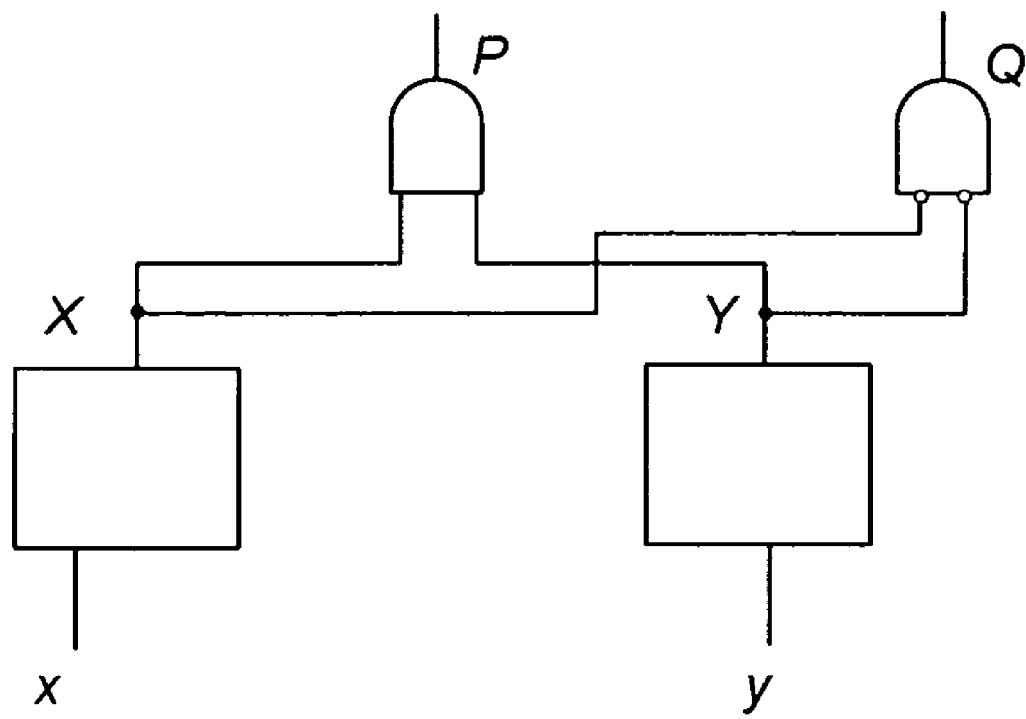

FIG. 6d is an illustrative drawing showing insertion of a second logic element so as to add a toggle to the first intermediate subcircuit $N_2^{1*}$ that had been removed through addition of the first logic element to the first subcircuit $N_2^1$. In this example, the second logic element is an AND gate having an inverter on each of its two inputs and having output Q. The output P of the first logic element and the output Q of the second logic element together define a modified first intermediate cut $C_1^{}$. The second logic element implements the logic function $Q=\sim x\hat{\ }\sim y$. Assuming the occurrence of the first toggle in the set $D_2^1$ shown in FIG. 7b**, the occurrence of the output sequence pair, (X=0, Y=1) followed by (X'=0, Y'=0)

results in a value Q=0 for (X=0, Y=1) and results in Q=1 for (X'=0, Y'=0). In other words, the value of Q changes. Therefore, insertion of the second logic element has the effect of adding the first toggle in the set $D_2^1$ of FIG. 7b. Thus, a modified first intermediate subcircuit $N_2^{1}$, having outputs P and Q that define the modified first intermediate cut $C_1^{}$ does include the toggle that had been absent in the (unmodified) first intermediate subcircuit $N_2^{1*}$.

Logic elements, such as the first and second logic elements described above, to effect toggle removal or toggle reinsertion may be selected in accordance with a cost function. For instance the cost function may involve identifying circuitry that achieves removal and/or reinsertion of toggles with the fewest number of logic gates, for example. Alternatively, the cost function may involve identifying circuitry that minimizes the number of logic levels in the second circuit $N_2$, for example. The cost function forms no part of the present invention. However, it should be appreciated that persons skilled in the art can develop cost functions to guide the selection of gates or combinations of gates to remove and/or reinsert toggles in accordance with the invention.

The next step is to remove redundant outputs from the modified first intermediate subcircuit $N_2^{1}$. Assume that in this example, there are none. So, the modified first intermediate subcircuit $N_2^{1}$ is determined to be the second subcircuit $N_2^2$. The next step is to determine whether there are toggles to be removed from the second subcircuit $N_2^2$.

Figure 7C:
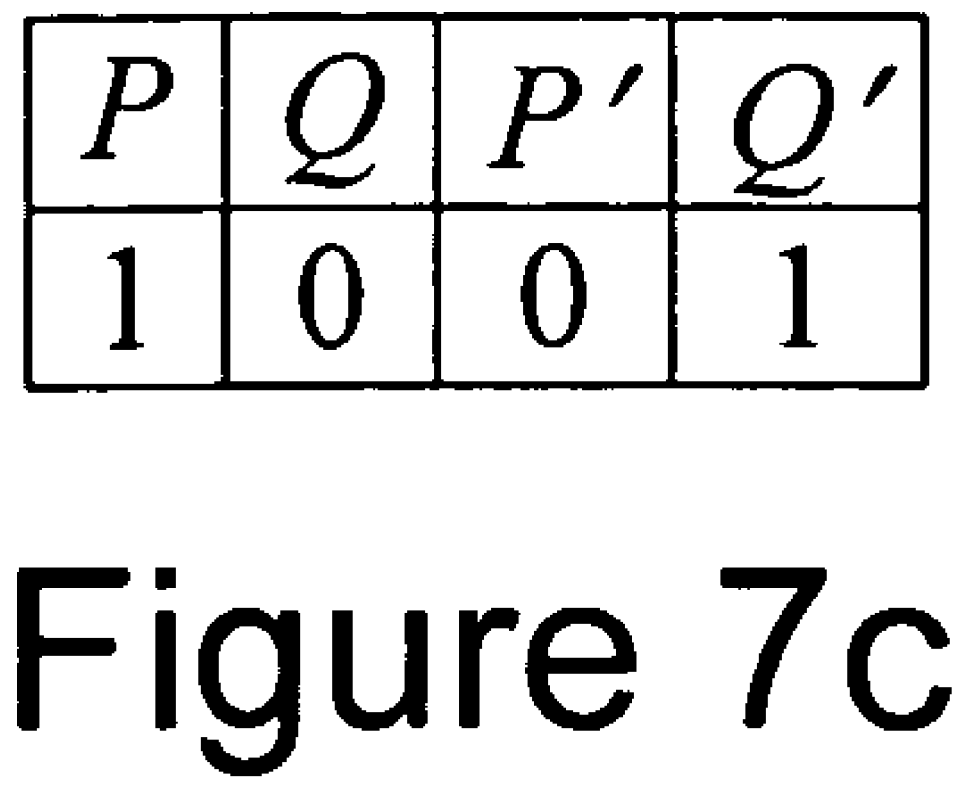

FIG. 7c is an illustrative chart showing a set of toggles $R_2^2$ of the second subcircuit $N_2^2$ to be removed because the first circuit $N_1$ does not have corresponding toggles. The toggle of the set $R_2^2$ of FIG. 7c to be removed represents a toggle in which output values for the output pair P and Q defining the second cut $C_2$, change between (P=1, Q=0) and (P'=0, Y'=1). More particularly, in the toggle to be removed, the value of output P toggles between P=1 and P'=0, and the value of output Q toggles between Q=0 and Q'=1.

For instance, assume that an (x, y) input sequence pair (x=1, y=1) followed by (x=0, y=0) is applied to both the first circuit $N_1$ and to the second subcircuit $N_2^2$. The corresponding (P, Q) output sequence pair of the second subcircuit $N_2^2$ is, (P=1, Q=0) followed by (P=0, Q=1). This is the output sequence pair for the toggle to be removed from the set $R_2^2$ of FIG. 7c. However, for that same input sequence pair, the output h of the first circuit $N_1$ does not toggle, since both the input combination (x=1, y=1) and the input combination (x=0, y=0) result in h=1. Thus, the toggle of FIG. 7c is identified as a candidate for removal.

Figure 6E:
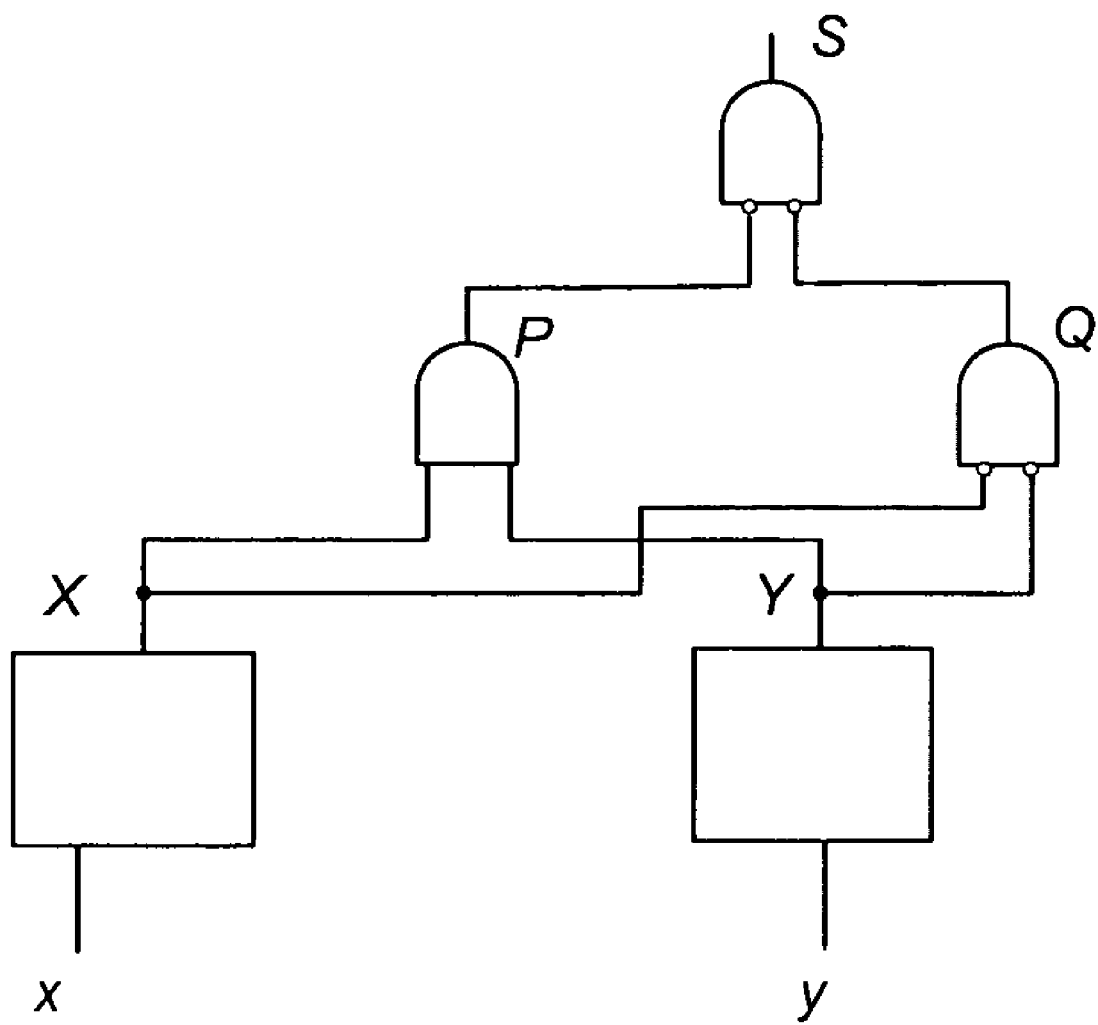

FIG. 6e is an illustrative drawing showing insertion of a third logic element so as to remove a toggle from the. second subcircuit $N_2^2$ and so as to produce a second intermediate subcircuit $N_2^{2*}$. In this example, the first logic element is an AND gate having an inverter on each of its two inputs and having an output S. The output S defines a second intermediate cut $C_2^*$. P and Q are not part of the second intermediate cut $C_2^*$. Thus, the third logic element implements the logic function S=~P^~Q. Assuming occurrence of the toggle in the set $R_2^2$ in FIG. 7c, the occurrence of the output sequence pair, (P=1, Q=0) followed by (P'=0, Q'=1) results in a value of S=0 for (P=1, Q=0) followed by S=0 for (P'=0, Q'=1). In other words, the value of S does not change. Therefore, insertion of the third logic element has the effect of removing the toggle in the set $R_2^2$ of FIG. 7c. Thus, the second intermediate subcircuit $N_2^{2*}$ does not include the removed toggle of that set $R_2^2$.

The next step is to add toggles to the second intermediate subcircuit $N_2^{2*}$. In this example, assume that the set $D_2^{2*}$, toggles to be reintroduced, is empty for the second intermediate subcircuit $N_2^{2*}$. There are no toggles that the first circuit $N_1$ has that the second intermediate subcircuit $N_2^{2*}$ does not have.

The next step is to remove redundant outputs from the second intermediate subcircuit $N_2^{2*}$. Assume that in this example there are none. So, the second intermediate subcircuit $N_2^{2*}$ is determined to be the third subcircuit $N_2^3$, and the second intermediate cut $C_2^*$ is determined to be the third cut $C_3$.

The next step is to determine whether there are toggles to be removed from the third subcircuit $N_2^3$. Assume that in this example there are none.

Therefore, the final circuit in this example is X=x, Y=y, P=x^y, Q=~x^~y, S=~P^~Q.

EXAMPLE 2

Figure 8A:
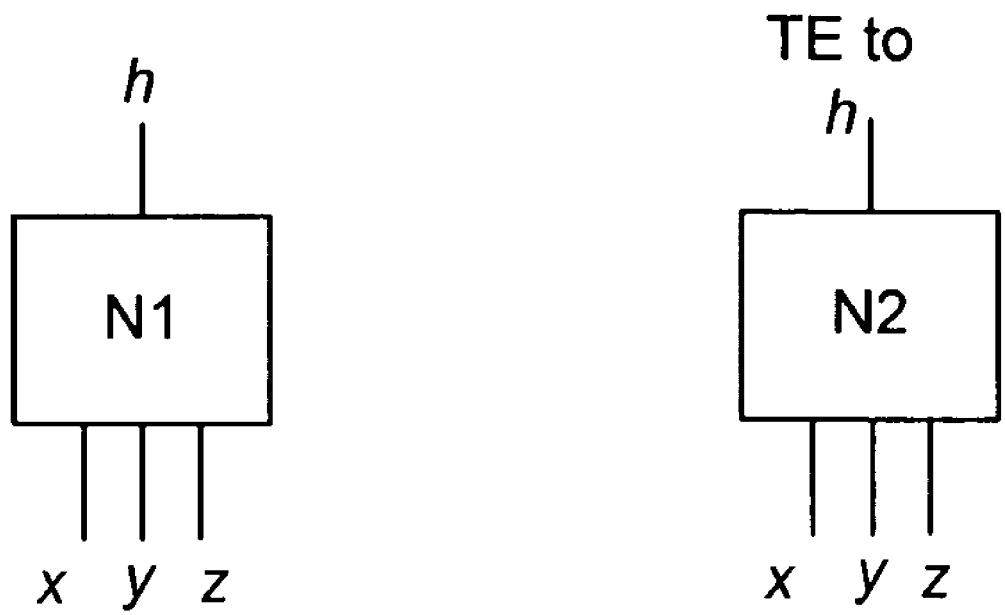
FIGS. 8a-8f are illustrative drawings showing construction of a circuit N2 that is toggle equivalent to circuit N1 in accordance with the TEP of FIG. 5.

FIG. 8a-8f show a sequence of subcircuits $N_2^i$ created in the course of developing a second circuit $N_2$ that is toggle equivalent to a first circuit $N_1$. FIG. 8a is an illustrative drawing of the first circuit $N_1$ and the second circuit $N_2$ in this example. The first circuit $N_1$ has inputs x, y and z and output h. In this example, assume that the first circuit $N_1$ implements a logical function h=x^z∨y^z. The second circuit $N_2$ is created in accordance with an embodiment of the invention to behave as a toggle equivalent to the first circuit $N_1$.

Figure 8B:
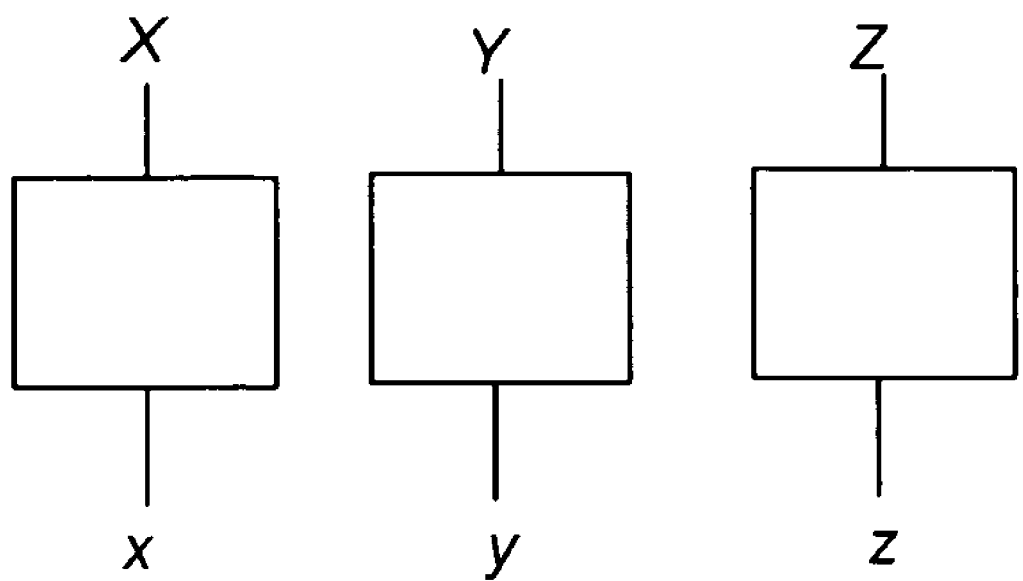

FIG. 8b shows a first subcircuit $N_2^1$ that consists of buffers on inputs x, y and z with outputs X, Y and Z respectively. In the first subcircuit $N_2^1$, X=x, Y=y; and Z=z; the inputs are x, y and z and the outputs are X, Y and Z. The first subcircuit $N_2^1$ has three outputs X, Y and Z, which define a first cut $C_1$.

Figure 9C:
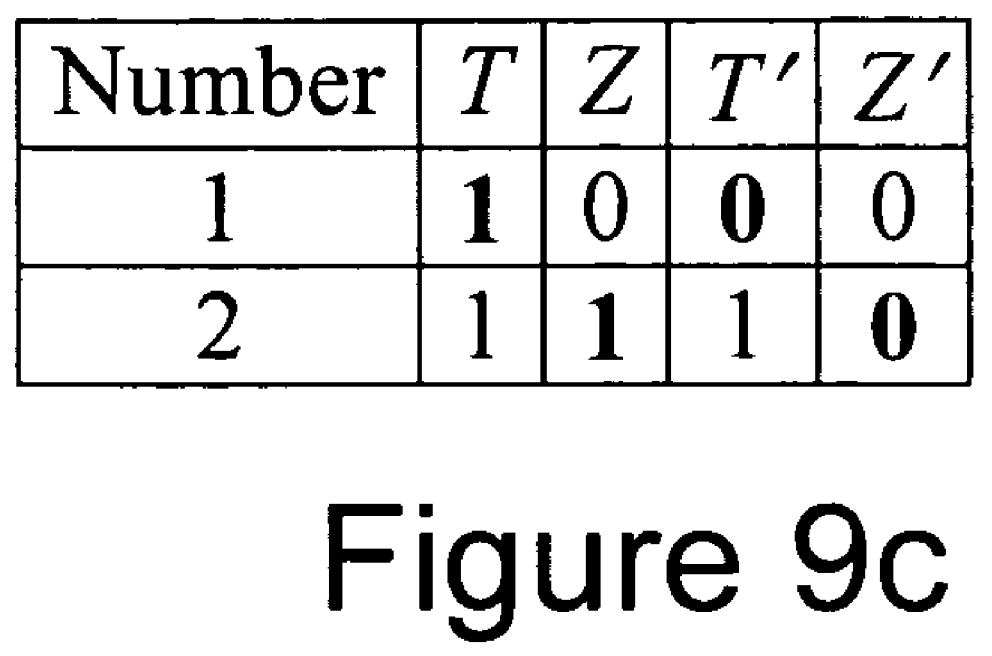

FIG. 9a is an illustrative chart showing a set $RR_2^1$ of all toggles of the first subcircuit $N_2^1$ of FIG. 8b to be removed because the first circuit $N_1$ does not have corresponding toggles. In the chart of FIG. 9a, X, Y and Z represent output values of half of a toggle pair, and X', Y' and Z' represent output values of the other half of the toggle pair. For example, the eighth toggle of the set $RR_2^1$ to be removed represents a toggle in which output values for the outputs X, Y and Z defining the first cut $C_1$, change between (X=1, Y=1, Z=0) and (X'=0, Y'=0, Z'=0). More particularly, in the eighth toggle to be removed, the value of output X toggles in that, X=1 and X'=0, and the value of output Y toggles in that, Y=1 and Y'=0, but the value of output Z does not toggle in that, Z=0 and Z'=0. Thus, two of the individual outputs toggle, i.e. change state.

FIG. 9b is an illustrative chart, which is a subset $RR'_2^1$ of the chart of FIG. 9a, showing toggles of the first subcircuit $N_2^1$ of FIG. 8b to be removed because the first circuit $N_1$ does not have corresponding toggles and in which only a single output toggles. (These toggles are referred to as distance-1 toggles.) In each toggle of the chart of FIG. 9b, the single output that toggles is indicated in bold. For example, referring to the first toggle in the chart of FIG. 9b, in the first toggle to be removed, the value of output X does not toggle in that, X=0 and X'=0, and the value of output Y does not toggle in that, Y=0 and Y'=0, but the value of output Z does toggle in that, Z=1 and Z'=0. Thus, only one of the individual outputs toggles, i.e. changes state.

The reason why toggles in table $RR'_2^i$ (i.e. distance-1 toggles) are favored over those of $RR_2^i$ is as follows. Removal of distance-1 toggles may have the effect of removing toggles of distance-k where k>1. For example, removing distance-1 toggles in which only output i or j or k toggles may also lead to removal of distance-2 toggles where outputs i,j or i,k or j,k toggle or distance-3 toggles where outputs i,j,k toggle.

Figure 8C:
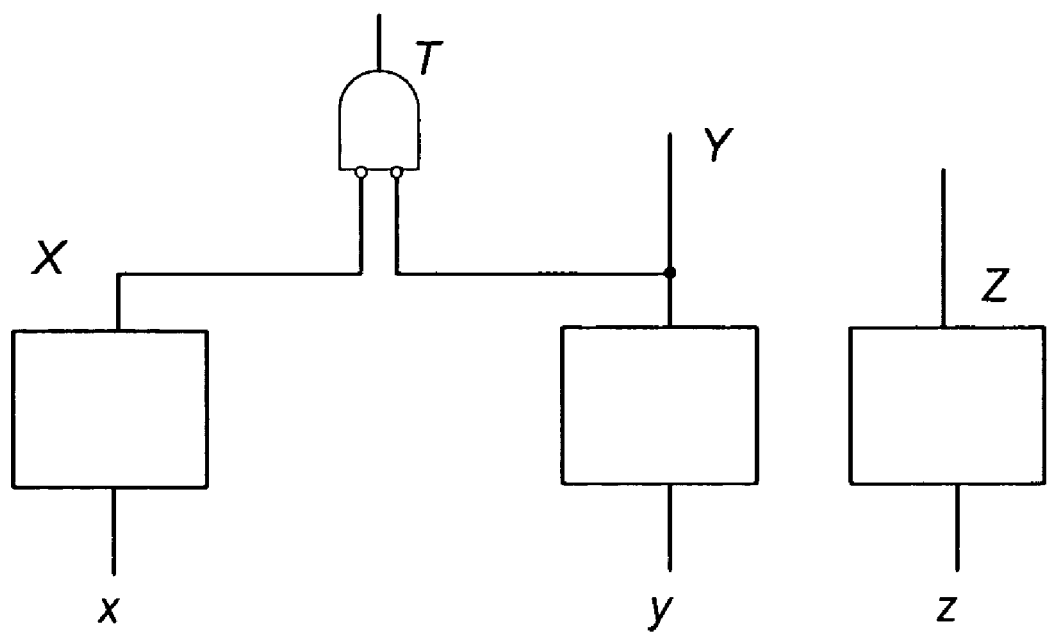

FIG. 8c is an illustrative drawing showing insertion of a first logic element so as to remove toggles from the first subcircuit $N_1^2$ and so as to produce a first intermediate subcircuit $N_2^{1*}$. In this example, the first logic element is an AND gate having an inverter on each of its two inputs and output T. The output T together with Y and Z define a first intermediate cut $C_1^*$. X is not part of the first intermediate cut $C_1^*$. Thus, the first logic element implements the logic function T=~x^~y. Assuming occurrence of the fourth toggle in the set $RR'_2^1$ in FIG. 9b, the occurrence of the output sequence pair, (X=1, Y=1, Z=0) followed by (X'=1, Y'=0, Z'=0) results in a value of T=0 for (X=1, Y=1, Z=0) followed by T=0 for (X'=1, Y'=0, Z'=0). In other words, the value of T does not change. Therefore, insertion of the first logic element has the effect of removing the fourth toggle in the set $RR'_2^1$ of FIG. 9b. Thus, the first intermediate subcircuit $N_2^{1*}$ of FIG. 8c does not include the removed fourth toggle of that set $RR'_2^1$. Note that output Y is not removed from the first intermediate cut since $C_1^*$ defined by the first intermediate subcircuit $N_2^{1*}$ since the value of output Y does not change in the fourth toggle of set $RR'_2^1$.

The next step is to add toggles to the first intermediate subcircuit $N_2^{1*}$. In this example, assume that the set of toggles to be reintroduced, is empty for the first intermediate subcircuit $N_2^{1*}$. There are no toggles that the first circuit $N_1$ has that the first intermediate subcircuit $N_2^{1*}$ does not have.

Figure 8D:
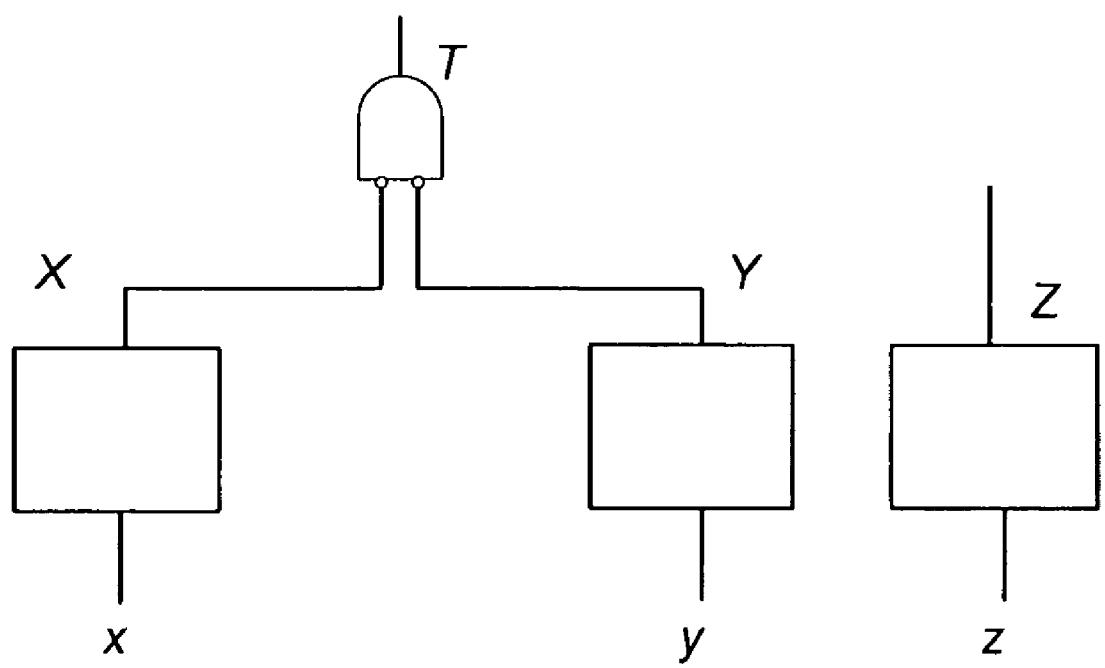

The next step is to remove redundant outputs from the first intermediate subcircuit $N_2^{1*}$. Assume that in this example output Y is redundant. Therefore, output Y is removed from the first intermediate cut $C_1^*$ so as to produce a modified first intermediate cut $C_1^{}$. FIG. 8d is an illustrative drawing of modified first intermediate subcircuit $N_2^{1}$ in which output Y is absent. The modified first intermediate subcircuit $N_2^{1}$ then is determined to be the second subcircuit $N_2^2$, and the modified first intermediate cut since $C_1^{}$ is determined to be the second cut $C_2$.

In the second subcircuit $N_2^2$, X=x, Z=z, and T=~x^~y. The second subcircuit $N_2^2$ has inputs x, y, z. It has outputs Z and T.

The next step is to determine whether there are toggles to be removed from the second subcircuit $N_2^2$. FIG. 8d is an illustrative drawing of the second subcircuit $N_2^2$.

Figure 8E:
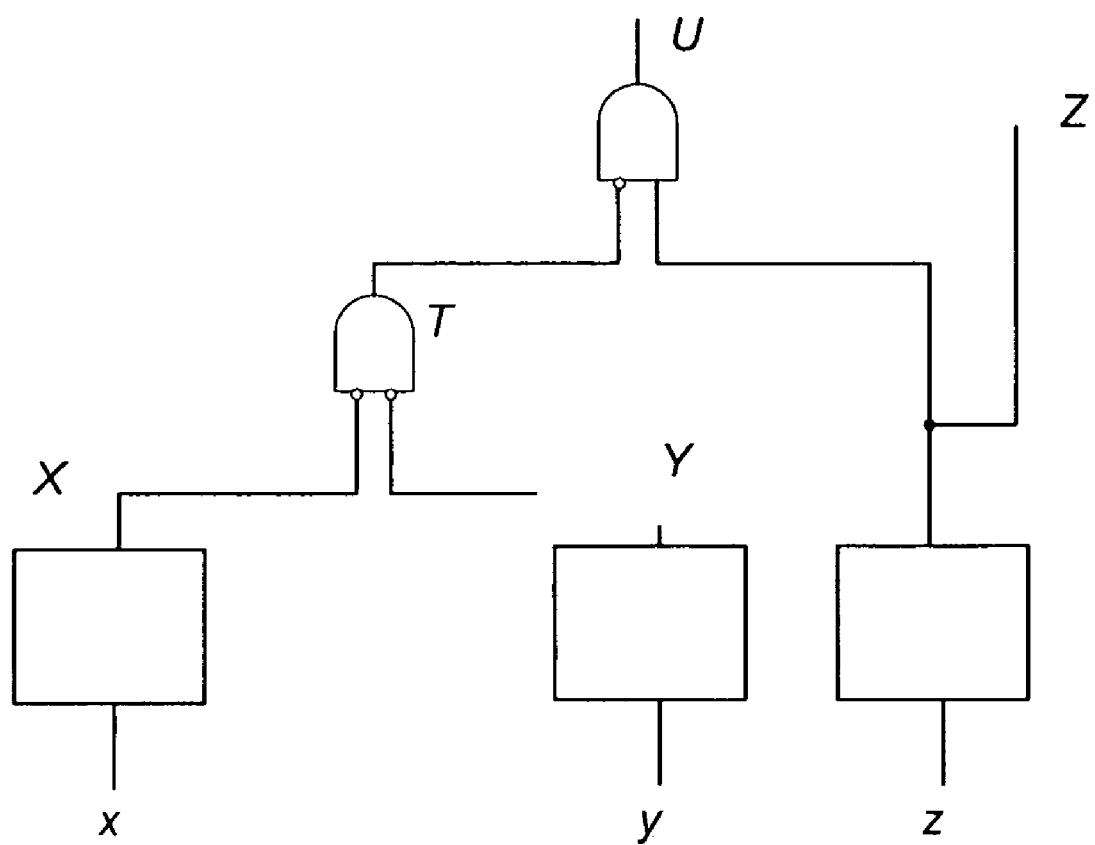

FIG. 8e is an illustrative drawing showing insertion of a second logic element so as to remove toggles from the second subcircuit $N_2^2$ and so as to produce a second intermediate subcircuit $N_2^{2*}$. In this example, the second logic element is an AND gate having an inverter on one of its inputs and having an output U. The U and Z outputs define a second intermediate cut $C_2^*$. The inverting input of the AND gate receives T, and the non-inverting input of the AND gate receives Z. Thus, the second logic element implements the logic function U=~T^Z. Assuming occurrence of the first toggle in the set $RR_2^2$ in the chart of FIG. 9c, the occurrence of the output sequence pair, (T=1, Z=0) followed by (T=0, Z=0) results in a value of U=0 for (T=1, Z=0) followed by U=0 for (T=0, Z=0). In other words, the value of U does not change. Therefore, insertion of the second logic element has the effect of removing the first toggle in the set $RR_2^2$ in the chart of FIG. 9c. Thus, the second intermediate subcircuit $N_2^{2*}$ does not include the removed first toggle of that set $RR_2^2$.

The next step is to add toggles to the second intermediate subcircuit $N2_2^*$. In this example, assume that the set of toggles to be reintroduced, is empty for the second intermediate subcircuit $N2_2^*$. There are no toggles that the first circuit N1 has that the second intermediate subcircuit $N2_2^*$ does not have.

Figure 8F:
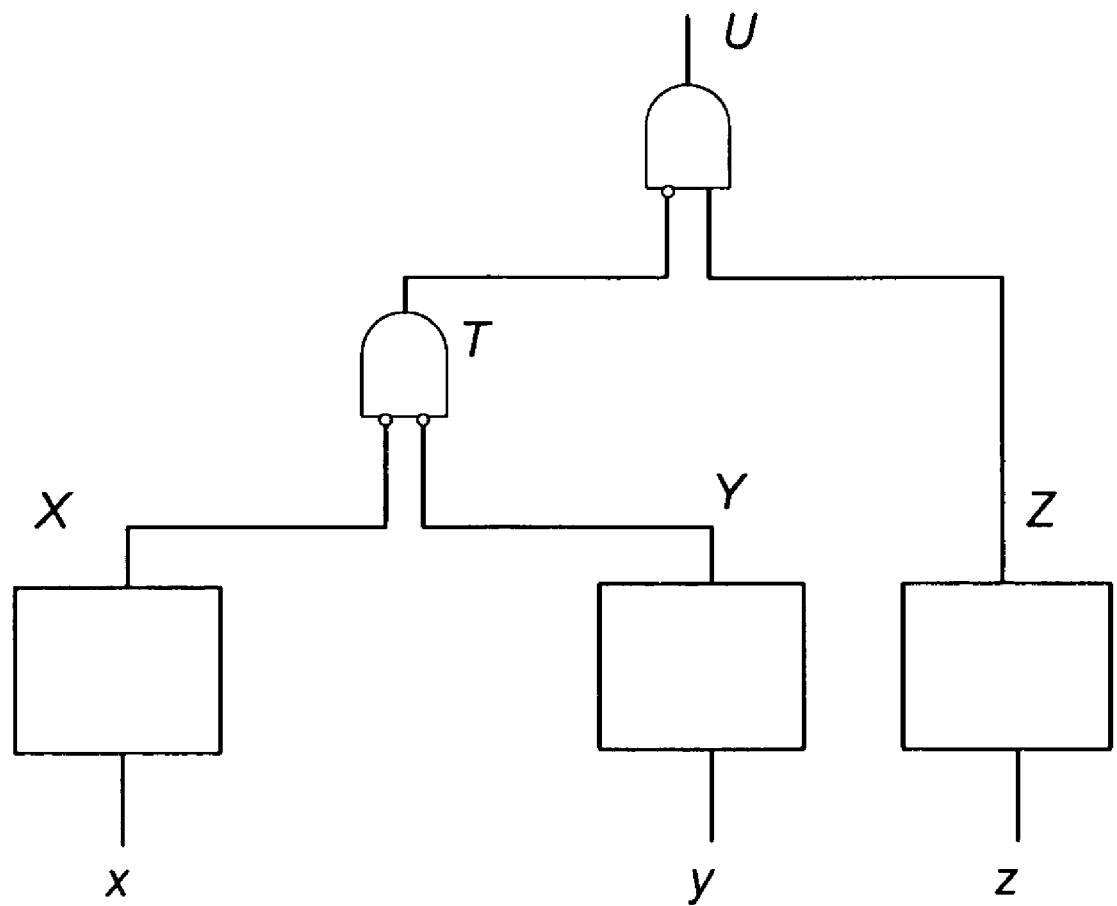

The next step is to remove redundant outputs from the second intermediate subcircuit $N_2^{2*}$. Assume that in this example output Z is redundant. Therefore, output Z is removed from the second intermediate cut $C_2^*$ so as to produce a modified second intermediate cut $C_2^{}$. FIG. 8f is an illustrative drawing of modified second intermediate subcircuit $N_2^{2}$ in which output Z has been removed. The modified second intermediate subcircuit $N_2^{2}$ then is determined to be the third subcircuit $N_2^3$, and the modified second intermediate cut $C_2^{}$ is determined to the third cut $C_3$.

In the third subcircuit $N_2^3$, X=x, Z=z, T=~x^~y, U=~T^Z. The third subcircuit $N_2^3$ has inputs x, y, z and output U.

Figure 10:
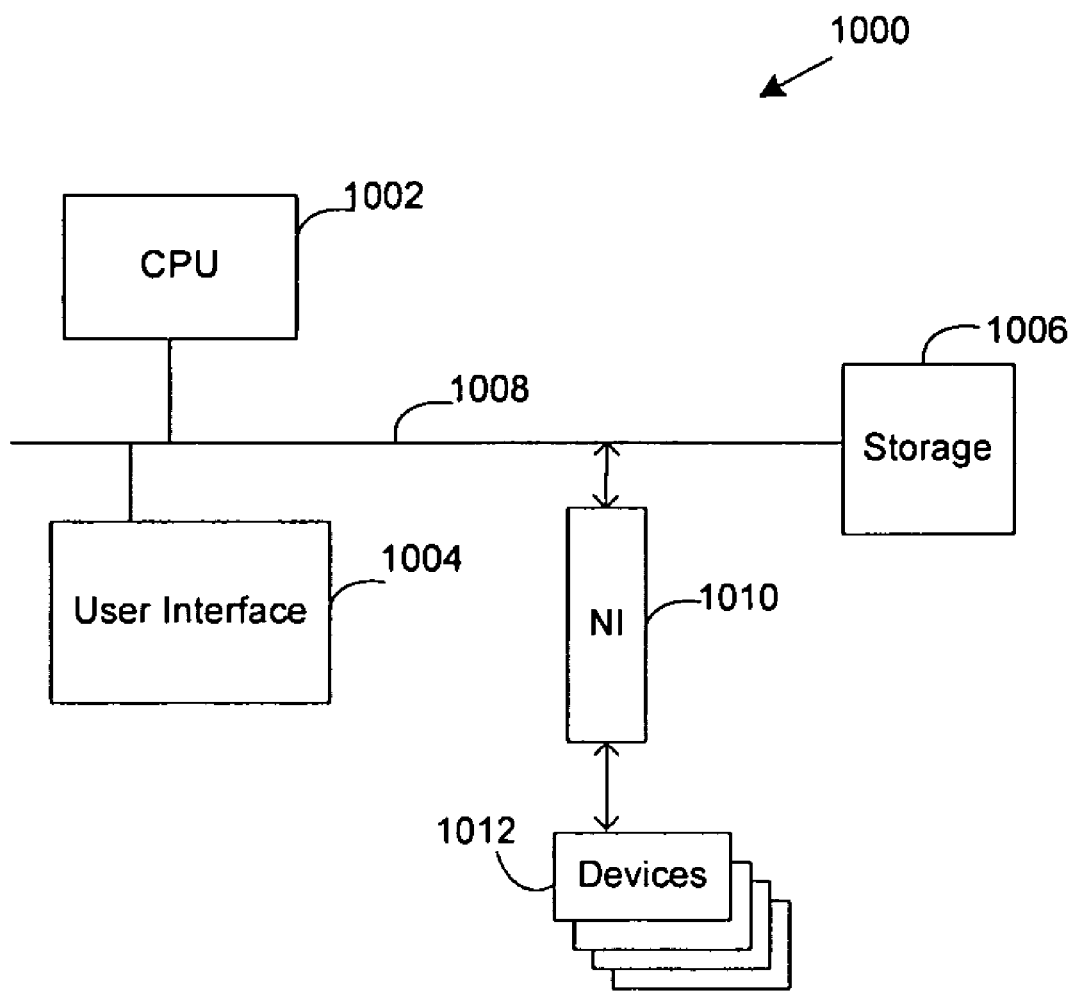
FIG. 10 is a schematic diagram of an illustrative computer system in which processes in accordance with embodiments of the invention may operate; the computer system includes or may communicate with a computer readable media that may be encoded with computer programs and circuit implementations in accordance with embodiments of the invention.

FIG. 10 is a schematic drawing of an illustrative computer system 1000 that can run a novel TEP process in accordance with an embodiment of the invention. The computer system 1000 includes one or more central processing units (CPU's) 1002, a user interface 1004, computer readable storage media 1006, a system bus 1008, and one or more bus interfaces for connecting the CPU, user interface, memory and system bus together. The computer system also includes a network interface 1010 for communicating with other devices 1012 on a computer network.

Computer readable model descriptions of first and second circuits $N_1$ and $N_2$ and subcircuits $N_2^i$ may be provided, via bus 1008, from interface 1004, storage 1008 or other devices 1012, to a TEP process running from storage 1008 on the CPU 1002. Similarly, cost parameter values and/or customization criteria may be provided to the TEP process. The TEP process produces the second circuit $N_2$, which is toggle equivalent to the first circuit $N_1$.

It will be understood that the foregoing description and drawings of preferred embodiment in accordance with the present invention are merely illustrative of the principles of this invention, and that various modifications can be made by those skilled in the art without departing from the scope and spirit of the invention.

The invention claimed is:

1. A method of circuit synthesis comprising:
   building up a second circuit $N_2$, that is toggle equivalent to a first circuit ($N_1$) by using a computer running a process to produce a sequence of circuits $N_{2(l)}$ through $N_{2(k)}$,
   wherein producing each circuit $N_{2(i)}$ in the sequence where i=1 . . . ,k, includes acts of,
   a) adding at least one first gate to a circuit $N_{2(i-1)}$;
   b) wherein adding the at least one first gate to the circuit $N_{2(i-1)}$ has the effect of eliminating at least one toggle of circuit $N_{2(i-1)}$ that lacks a corresponding output toggle in circuit $N_1$;
   c) wherein $N_{2(i)}$ includes $N_{2(i-1)}$ as modified by the addition of the at least one first gate and outputs of $N_{2(i-1)}$ form a cut of $N_{2(i)}$;
   d) wherein output toggling of circuit $N_1$ implies output toggling of circuit $N_{2(i-1)}$; and
   e) wherein output toggling of $N_{2(i)}$ strictly implies output toggling of $N_{2(i-1)}$.

2. The method of claim 1 wherein producing the sequence of circuits $N_{2(l)}$ through $N_{2(k)}$ includes acts of,
   determining whether there are one or more output toggles in $N_1$ that lack a corresponding output toggle in an intermediate circuit defined by $N_{2(i-1)}$ as modified by the addition of the at least one first gate; and
   when one or more corresponding toggles in the intermediate circuit are determined to be lacking, then adding one or more gates to that modified circuit that have the effect of adding at least one output toggle corresponding to at least one output toggle of $N_1$ for which a corresponding toggle is determined to be lacking in the intermediate circuit.

3. The method of claim 1 wherein producing a circuit $N_{2(i)}$ further includes:
  determining whether one or more outputs of circuit $N_{2(i-1)}$ as modified by adding at least one first gate are redundant with respect to toggles of $N_1$; and
  when one or more outputs are determined to be redundant, then removing from the circuit $N_{2(i-1)}$ as modified by adding at least one first gate, at least one output determined to be redundant.

4. The method of claim 2 or 3 further including:
  producing a different circuit $N_{2(i)}$ for i=1, ...,k.
  terminating if output toggling of a circuit $N_{2(k)}$ implies the toggling of circuit $N_1$ and returning circuit $N_{2(k)}$ as toggle equivalent to $N_1$.

5. The method of claim 2 or 3 wherein,
  identifying one or more output toggles in circuit $N_{2(i-1)}$ that lack a corresponding output toggle in $N_1$ includes at least one of performing a SAT check or producing a BDD; and
  determining whether there are one or more output toggles in $N_1$ that lack a corresponding output toggle in an intermediate circuit defined by $N_{2(i-1)}$ as modified by the addition of the at least one first gate includes at least one of performing a SAT check or producing a BDD.

6. The method of claim 2 or 3 wherein,
  determining whether one or more outputs of circuit $N_{2(i-1)}$ as modified by adding at least one first gate, are redundant with respect to toggles of $N_1$ includes at least one of performing a SAT check or producing a BDD.

7. The method of claim 2 further including:
  producing a different circuit $N_{2(i)}$ for every i=1, . . . ,k.

8. The method of claim 1 wherein producing the sequence of circuits $N_{2(l)}$ through $N_{2(k)}$ includes producing a circuit $N_{2(i)}$ a different circuit $N_{2(i)}$ for i=1, . . . ,k. comprising:
  identifying one or more output toggles in circuit $N_{2(i-1)}$ that lack a corresponding output toggle in $N_1$ by performing a SAT check or producing a BDD;
  determining whether there are one or more output toggles in $N_1$ that lack a corresponding output toggle in an intermediate circuit defined by $N_{2(i-1)}$ as modified by the addition of the at least one first gate by performing a SAT check or producing a BDD;
  when one or more corresponding toggles in the intermediate circuit are determined to be lacking, then adding one or more gates to that modified circuit $N_{2(i-1)}$ that have the effect of adding at least one output toggle corresponding to at least one output toggle of $N_1$ for which a corresponding toggle is determined to be lacking in the intermediate circuit;
  determining whether one or more outputs of circuit $N_{2(i-1)}$ as modified by adding at least one first gate, are redundant with respect to toggles of $N_1$ by performing a SAT check or producing a BDD;
  when one or more outputs are determined to be redundant, then removing from the circuit $N_{2(i-1)}$ as modified by adding at least one first gate, at least one output determined to be redundant;
  terminating if output toggling of a circuit $N_{2(k)}$ implies the toggling of circuit $N_1$ and returning circuit $N_{2(k)}$ as toggle equivalent to $N_1$.

9. The method of claim 1 further including:
  building a correlation function that relates inputs of $N_{2(l)}$ to $N_{2(k)}$ to inputs of $N_1$.

10. The method of claim 1 and further including:
  building a correlation function that relates inputs of circuits $N_{2(l)}$ to $N_{2(k)}$ to inputs of $N_1$;
  using the correlation function in the course of identifying one or more output toggles in circuit $N_{2(i-1)}$ that lack a corresponding output toggle in $N_1$;
  adding at least one first gate to circuit $N_{2(i-1)}$ that has the effect of removing at least one toggle of the one or more identified output toggles in circuit $N_{2(i-1)}$ that lack a corresponding output toggle in circuit $N_1$;
  using the correlation function in the course of determining whether there are one or more output toggles in $N_1$ that lack a corresponding output toggle in an intermediate circuit defined by $N_{2(i-1)}$ as modified by the addition of the at least one first gate; and
  when one or more corresponding toggles in the intermediate circuit are determined to be lacking, then adding one or more gates to circuit $N_{2(i-1)}$ that have the effect of adding at least one output toggle corresponding to at least one output toggle of $N_1$ for which a corresponding toggle is determined to be lacking in the intermediate circuit.

11. The method of claim 10 and further including:
  using the correlation function in the course of determining whether one or more outputs of circuit $N_{2(i-1)}$ as modified by adding at least one first gate, are redundant with respect to toggles of $N_1$; and
  when one or more outputs are determined to be redundant, then removing from the circuit $N_{2(i-1)}$ as modified by adding at least one first gate, at least one output determined to be redundant.

12. A computer readable medium encoded with the first circuit $N_1$ produced by the process of claim 1, 2, 3, 4 or 9.

13. A method of producing a circuit comprising:
  using a computer running a process to produce a circuit $N_{2(i)}$ from a circuit $N_{2(i-1)}$ that is toggle equivalent to a first circuit ($N_1$) that includes the acts of,
  identifying one or more output toggles in circuit $N_{2(i-1)}$ that lack a corresponding output toggle in a circuit $N_1$;
  adding at least one first gate to circuit $N_{2(i-1)}$ that has the effect of removing at least one toggle of the one or more identified output toggles in circuit $N_{2(i-1)}$ that lack a corresponding output toggle in circuit $N_1$;
  determining whether there are one or more output toggles in $N_1$ that lack a corresponding output toggle in an intermediate circuit defined by $N_{2(i-1)}$ as modified by the addition of the at least one first gate; and
  when one or more corresponding toggles in the intermediate circuit are determined to be lacking, then adding one or more gates to circuit $N_{2(i-1)}$ that have the effect of adding at least one output toggle corresponding to at least one output toggle of $N_1$ for which a corresponding toggle is determined to be lacking in the intermediate circuit.

14. The method of claim 13 further including:
  determining whether one or more outputs of circuit $N_{2(i-1)}$ as modified by adding at least one first gate, are redundant with respect to toggles of circuit $N_1$; and
  when one or more outputs are determined to be redundant, then removing from the circuit $N_{2(i-1)}$ as modified by adding at least one first gate, at least one output determined to be redundant.

15. The method of claim 14 and further including:
  using the correlation function in the course of determining whether one or more outputs of circuit $N_{2(i-1)}$ as modified by adding at least one first gate, are redundant with respect to toggles of $N_1$; and when one or more outputs are determined to be redundant, then removing from the circuit $N_{2(i-1)}$ as modified by adding at least one first gate, at least one output determined to be redundant.

16. The method of claim 12 wherein,
identifying one or more output toggles in circuit $N_{2(i-1)}$ that lack a corresponding output toggle in $N_1$ includes at least one of performing a SAT check or producing a BDD; and
determining whether there are one or more output toggles in $N_1$ that lack a corresponding output toggle in an intermediate circuit defined by $N_{2(i-1)}$ as modified by the addition of the at least one first gate includes at least one of performing a SAT check or producing a BDD.

17. The method of claim 13 wherein,
determining whether one or more outputs of circuit $N_{2(i-1)}$ as modified by adding at least one first gate, are redundant with respect to toggles of $N_1$ includes at least one of performing a SAT check or producing a BDD.

18. The method of claim 13 further including:
building a correlation function that relates inputs of $N_{2(i-1)}$ to inputs of $N_1$.

19. The method of claim 13 and further including:
building a correlation function that relates inputs of $N_{2(i-1)}$ to inputs of $N_1$;
using the correlation function in the course of identifying one or more output toggles in circuit $N_{2(i-1)}$ that lack a corresponding output toggle in $N_1$;
adding at least one first gate to circuit $N_{2(i-1)}$ that has the effect of removing at least one toggle of the one or more identified output toggles in circuit $N_{2(i-1)}$ that lack a corresponding output toggle in circuit $N_1$;
using the correlation function in the course of determining whether there are one or more output toggles in $N_1$ that lack a corresponding output toggle in an intermediate circuit defined by $N_{2(i-1)}$ as modified by the addition of the at least one first gate; and
if one or more corresponding toggles in the intermediate circuit are determined to be lacking, then adding one or more gates to circuit $N_{2(i-1)}$ that have the effect of adding at least one output toggle corresponding to at least one output toggle of $N_1$ for which a corresponding toggle is determined to be lacking in the intermediate circuit.

20. A computer readable medium encoded with the first circuit $N_1$ produced by the process of claim 13, 14, 16 or 18.

21. A computer readable medium encoded with code to cause performance of a process of circuit synthesis comprising:
building up a second circuit $N_2$ that is toggle equivalent to a first circuit ($N_1$), by using a computer running a process to produce sequence of circuits $N_{2(l)}$ through $N_{2(k)}$, wherein producing each circuit $N_2(i)$ in the sequence where i=1, ... k, includes acts of,
a) adding at least one first gate to a circuit $N_{2(i-1)}$;
b) wherein adding the at least one first gate to the circuit $N_{2(i-1)}$ has the effect of eliminating at least one toggle of circuit $N_{2(i-1)}$ that lacks a corresponding output toggle in circuit $N_1$;
c) wherein $N_{2(i)}$ ) includes $N_{2(i-1)}$ as modified by the addition of the at least one first gate and outputs of $N_{2(i-1)}$ form a cut of $N_{2(i)}$;
d) wherein output toggling of circuit $N_1$ implies output toggling of circuit $N_{2(i-1)}$; and
e) wherein output toggling of $N_{2(i)}$ strictly implies output toggling of $N_{2(i-1)}$.

22. The computer readable medium of claim 21, wherein the process further includes:
producing the sequence of circuits $N_{2(1)}$ through $N_{2(k)}$ includes producing a circuit $N_{2(i)}$ comprising the:
determining whether there are one or more output toggles in $N_1$ that lack a corresponding output toggle in an intermediate circuit defined by $N_{2(i-1)}$ as modified by the addition of the at least one first gate; and
when one or more corresponding toggles in the intermediate circuit are determined to be lacking, then adding one or more gates to that modified circuit that have the effect of adding at least one output toggle corresponding to at least one output toggle of $N_1$ for which a corresponding toggle is determined to be lacking in the intermediate circuit.

23. The computer readable medium of claim 22, wherein the process further includes:
determining whether one or more outputs of circuit $N_{2(i-1)}$ as modified by adding at least one first gate, are redundant with respect to toggles of $N_1$; and
when one or more outputs are determined to be redundant, then removing from the circuit $N_{2(i-1)}$ as modified by adding at least one first gate, at least one output determined to be redundant.

24. The computer readable medium of claim 22 or 23, wherein the process further includes:
producing a different circuit $N_{2(i)}$ for i=1, ... ,k.
terminating if output toggling of a circuit $N_{2(k)}$ implies the toggling of circuit $N_1$ and returning circuit $N_{2(k)}$ as toggle equivalent to $N_1$.

25. The method of claim 21, wherein the process further includes:
building a correlation function that relates inputs of $N_{2(l)}$ to $N_{2(k)}$ to inputs of $N_1$.

26. The computer readable medium of claim 25, wherein the process further includes:
determining whether one or more outputs of circuit $N_{2(i-1)}$ as modified by adding at least one first gate, are redundant with respect to toggles of circuit $N_1$; and
when one or more outputs are determined to be redundant, then removing from the circuit $N_{2(i-1)}$ as modified by adding at least one first gate, at least one output determined to be redundant.

27. A computer readable medium encoded with code to cause performance of a process of producing a circuit comprising:
using a computer running a process to produce a circuit $N_{2(i)}$ from a circuit $N_{2(i-1)}$, that is toggle equivalent to a first circuit ($N_1$), that includes the acts of,
identifying one or more output toggles in circuit $N_{2(i-1)}$ that lack a corresponding output toggle in a circuit $N_1$;
adding at least one first gate to circuit $N_{2(i-1)}$ that has the effect of removing at least one toggle of the one or more identified output toggles in circuit $N_{2(i-1)}$ that lack a corresponding output toggle in circuit $N_1$;
determining whether there are one or more output toggles in $N_1$ that lack a corresponding output toggle in an intermediate circuit defined by $N_{2(i-1)}$ as modified by the addition of the at least one first gate; and
when one or more corresponding toggles in the intermediate circuit are determined to be lacking, then adding one or more gates to circuit $N_{2(i-1)}$ that have the effect of adding at least one output toggle corresponding to at least one output toggle of $N_1$ for which a corresponding toggle is determined to be lacking in the intermediate circuit.

28. The computer readable medium of claim 27, wherein the process further includes:
building a correlation function that relates inputs of $N_{2(i-1)}$ to inputs of $N_1$.

29. A system to synthesize a circuit comprising:
means for building up second circuit $N_2$ that is toggle equivalent to a first circuit ($N_1$), by producing a sequence of circuits $N_{2(l)}$ through $N_{2(k)}$, wherein producing each circuit $N_{2(i)}$ in the sequence where i=1..., k, includes acts of,
  a) adding at least one first gate to a circuit $N_{2(i-1)}$;
  b) wherein adding the at least one first gate to the circuit $N_{2(i-1)}$ has the effect of eliminating at least one toggle of circuit $N_{2(i-1)}$ that lacks a corresponding output toggle in circuit $N_1$;
  c) wherein $N_{2(i)}$ includes $N_{2(i-1)}$ as modified by the addition of the at least one first gate and outputs of $N_{2(i-1)}$ form a cut of $N_{2(i)}$;
  d) wherein output toggling of circuit $N_1$ implies output toggling of circuit $N_{2(i-1)}$; and
  e) wherein output toggling of $N_{2(i)}$ strictly implies output toggling of $N_{2(i-1)}$.

30. The system of claim 29 further comprising:
means for determining whether there are one or more output toggles in $N_1$ that lack a corresponding output toggle in an intermediate circuit defined by $N_{2(i-1)}$ as modified by the addition of the at least one first gate; and
means for adding one or more gates to circuit in the intermediate circuit, defined by $N_{2(i-1)}$ as modified by the addition of the at least one first gate, that have the effect of adding at least one output toggle corresponding to at least one output toggle of $N_1$ for which a corresponding toggle is determined to be lacking in the intermediate circuit, when one or more corresponding toggles in the intermediate circuit are determined to be lacking.

31. The system of claim 30 further including:
means for determining whether one or more outputs of circuit $N_{2(i-1)}$ as modified by adding at least one first gate, are redundant with respect to toggles of circuit $N_1$; and
means for removing from the circuit $N_{2(i-1)}$ as modified by adding at least one gate, at least one output determined to be redundant, if one or more outputs are determined to be redundant.

* * * * *